(12) United States Patent
Shibata et al.

(10) Patent No.: US 8,188,449 B2
(45) Date of Patent: May 29, 2012

(54) CHARGED PARTICLE BEAM DRAWING METHOD AND APPARATUS

(75) Inventors: Hayato Shibata, Numazu (JP); Hitoshi Higurashi, Kanagawa (JP); Akihito Anpo, Tokyo (JP); Jun Yashima, Kanagawa (JP); Shigehiro Hara, Kanagawa (JP); Susumu Oogi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 148 days.

(21) Appl. No.: 12/816,773

(22) Filed: Jun. 16, 2010

(65) Prior Publication Data
US 2011/0012031 A1  Jan. 20, 2011

(30) Foreign Application Priority Data
Jul. 15, 2009  (JP) ................ 2009-167179

(51) Int. Cl.
G21K 5/10 (2006.01)
G06F 19/00 (2006.01)
(52) U.S. Cl. .............. 250/492.22; 250/492.2; 250/492.3
(58) Field of Classification Search .... 250/492.1–492.3; 716/50; 700/121
See application file for complete search history.

(56) References Cited

U.S. PATENT DOCUMENTS

| | | | | |
|---|---|---|---|---|
| 7,504,645 B2 * | 3/2009 | Anpo et al. | ............. | 250/492.22 |
| 2008/0023655 A1 * | 1/2008 | Sakamoto et al. | ....... | 250/492.22 |
| 2008/0221816 A1 | 9/2008 | Anpo et al. | | |
| 2009/0057575 A1 | 3/2009 | Oogi et al. | | |
| 2009/0194710 A1 * | 8/2009 | Shibata | ...................... | 250/492.2 |

FOREIGN PATENT DOCUMENTS

| | | |
|---|---|---|
| JP | 2008-85248 | 4/2008 |
| JP | 2008-218767 | 9/2008 |
| JP | 2008-218857 | 9/2008 |
| JP | 2009-64862 | 3/2009 |

OTHER PUBLICATIONS

U.S. Appl. No. 13/288,530, filed Nov. 3, 2011, Yashima.
U.S. Appl. No. 13/235,432, filed Sep. 18, 2011, Nakayamada, et al.

* cited by examiner

*Primary Examiner* — Jack Berman
*Assistant Examiner* — David E Smith
(74) *Attorney, Agent, or Firm* — Oblon, Spivak, McClelland, Maier & Neustadt, L.L.P.

(57) ABSTRACT

A charged particle beam drawing apparatus for drawing patterns corresponding to figures in a drawing data, has a portion for dividing a drawing area on the workpiece into block frames, a portion for combining at least a first block frame and a second block frame into a virtual block frame, and a portion for transferring a data of the virtual block frame from an input data dividing module to a common memory of a first converter and a second converter. The first converter converts a data of a first figure included in the first block frame into a first drawing apparatus internal format data. The second converter converts a data of a second figure included in the second block frame into a second drawing apparatus internal format data. The first figure and the second figure are included in a cell extending over the first block frame and the second block frame.

10 Claims, 25 Drawing Sheets

FIG. 1 charged particle beam drawing apparatus 10

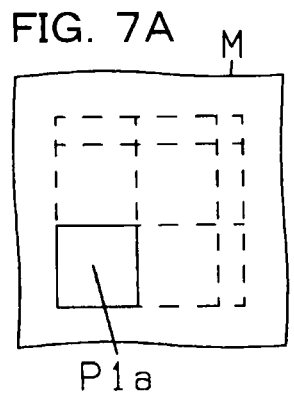
FIG. 7A  P1a
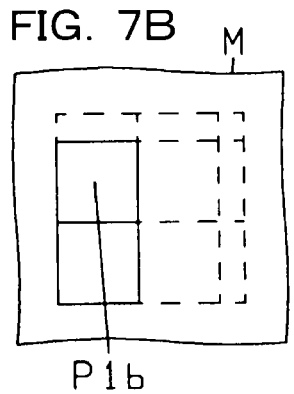
FIG. 7B  P1b
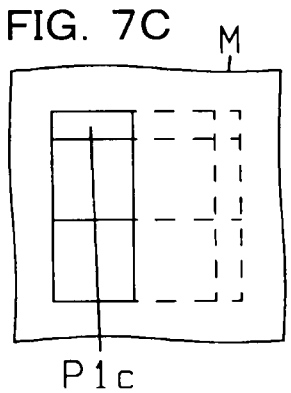
FIG. 7C  P1c
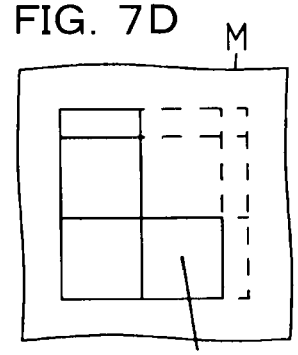
FIG. 7D  P1d
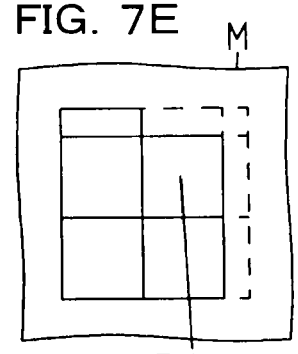
FIG. 7E  P1e
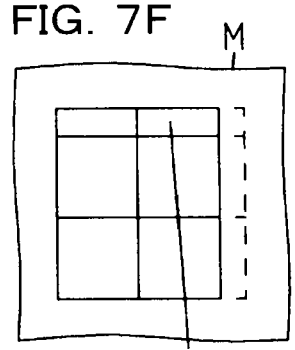
FIG. 7F  P1f
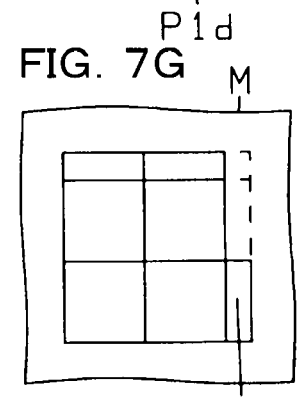
FIG. 7G  P1g
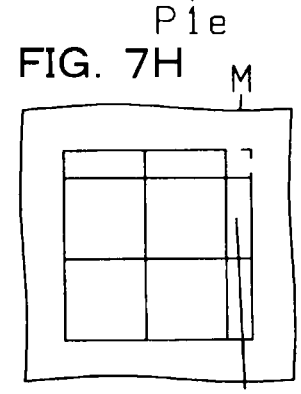
FIG. 7H  P1h
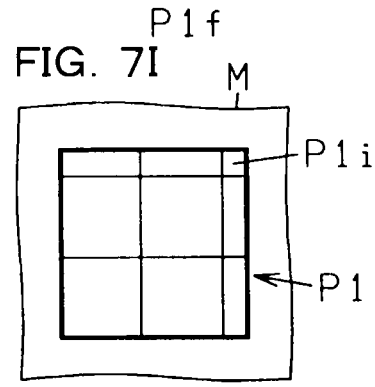
FIG. 7I  P1i  P1

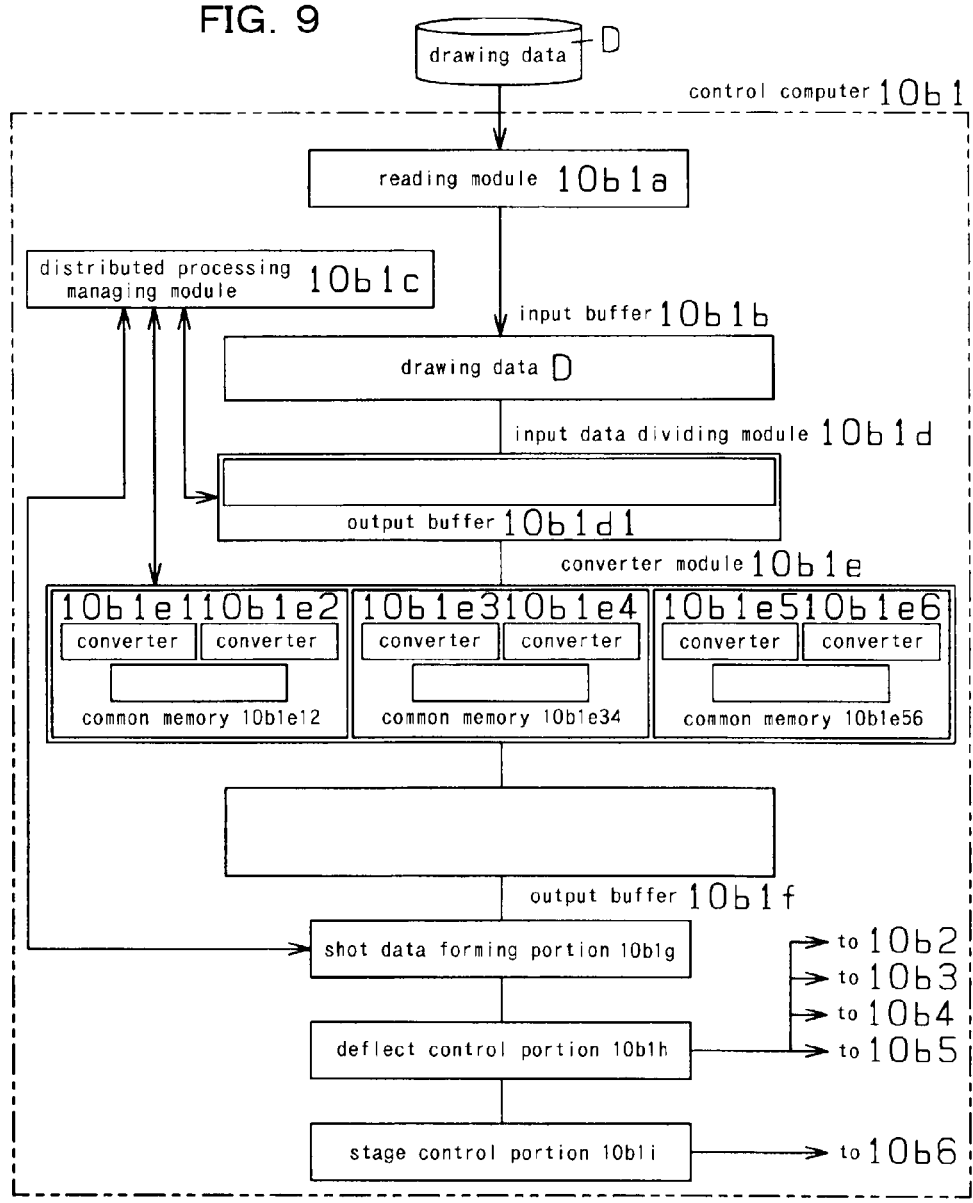

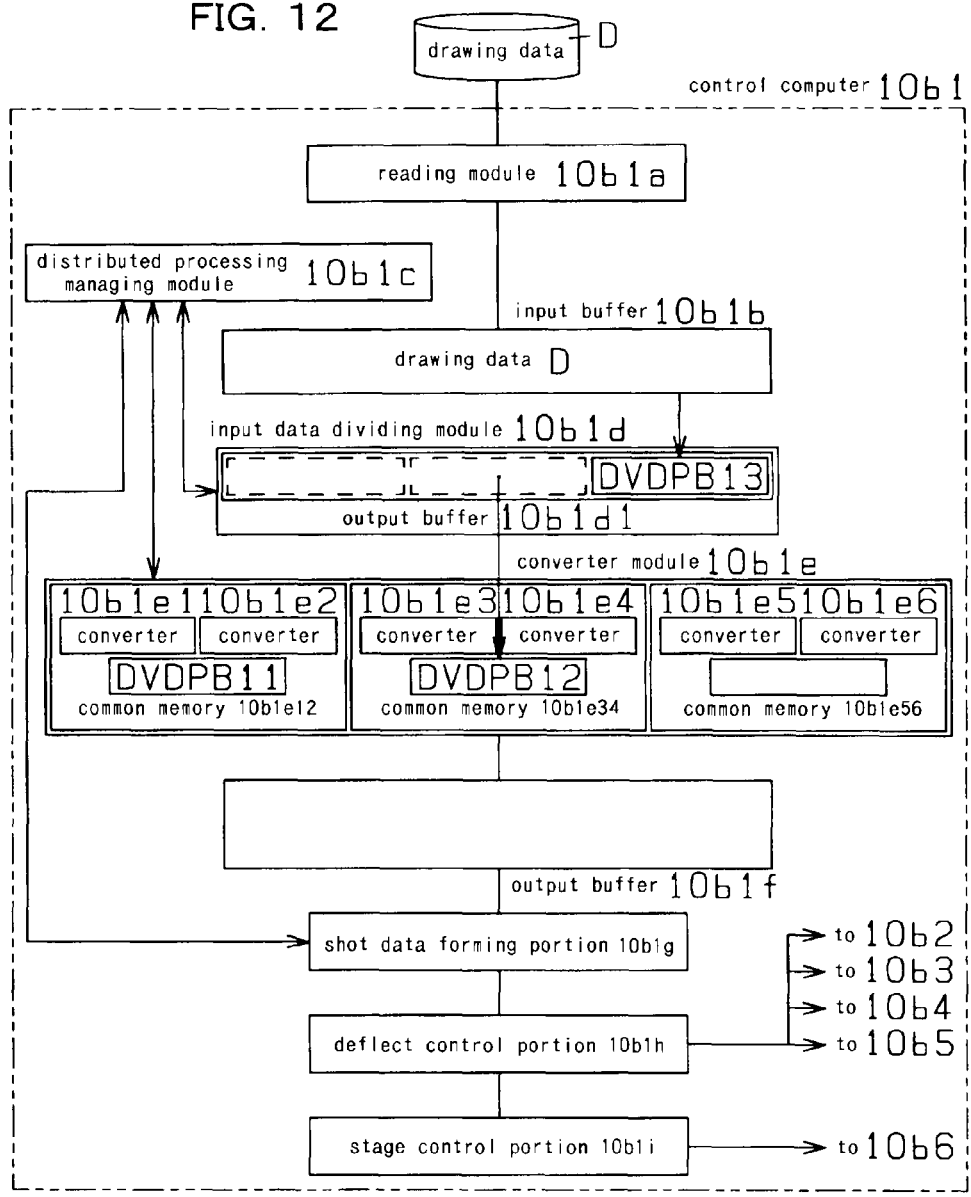

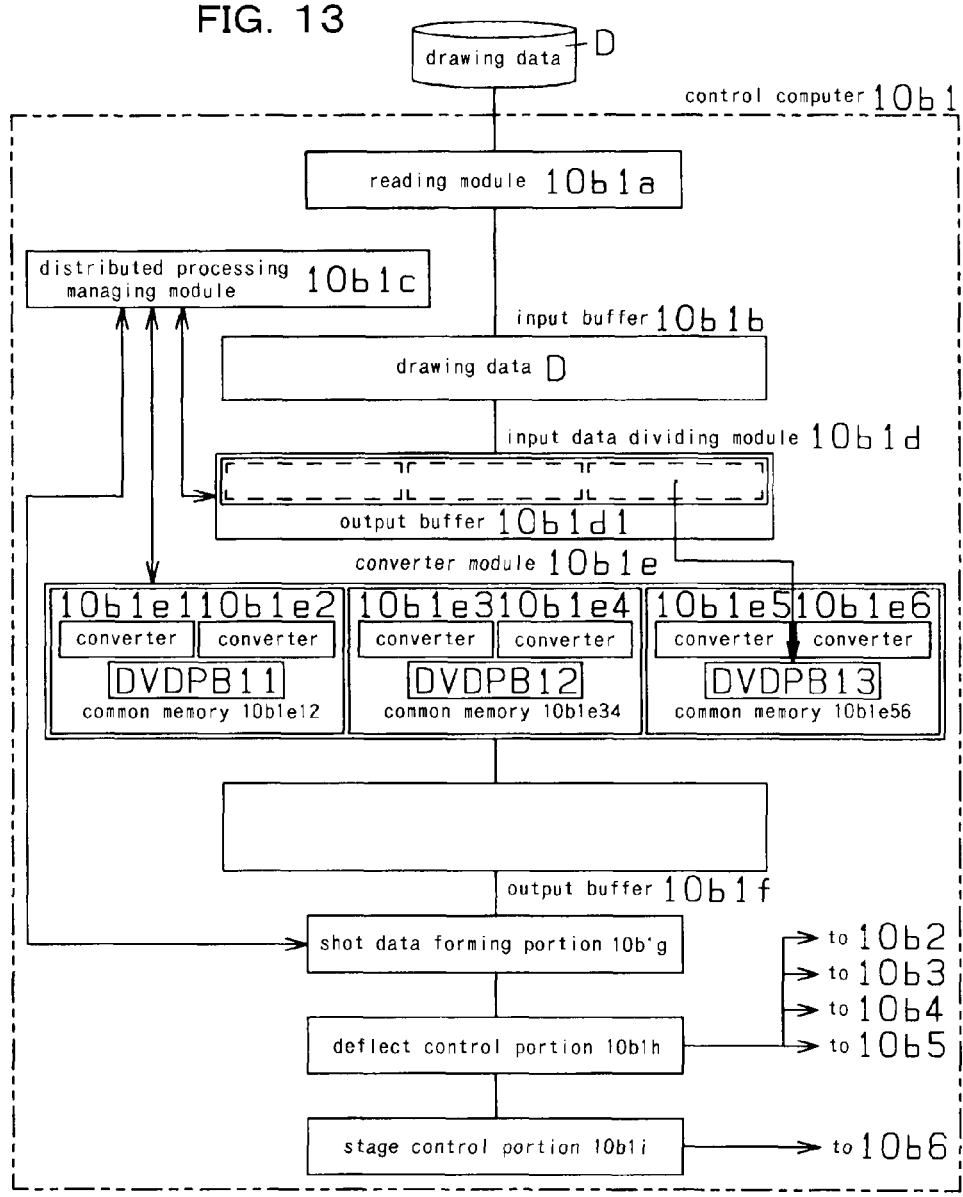

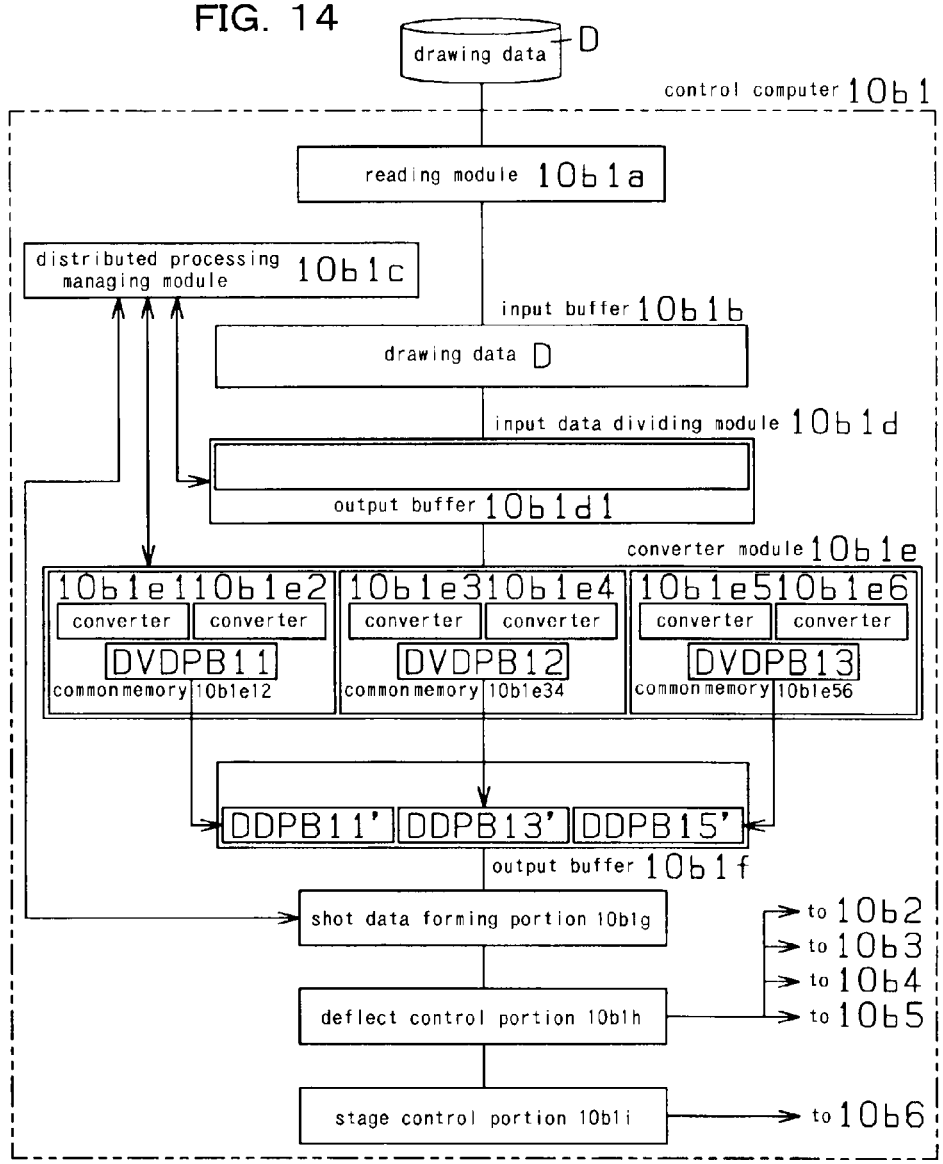

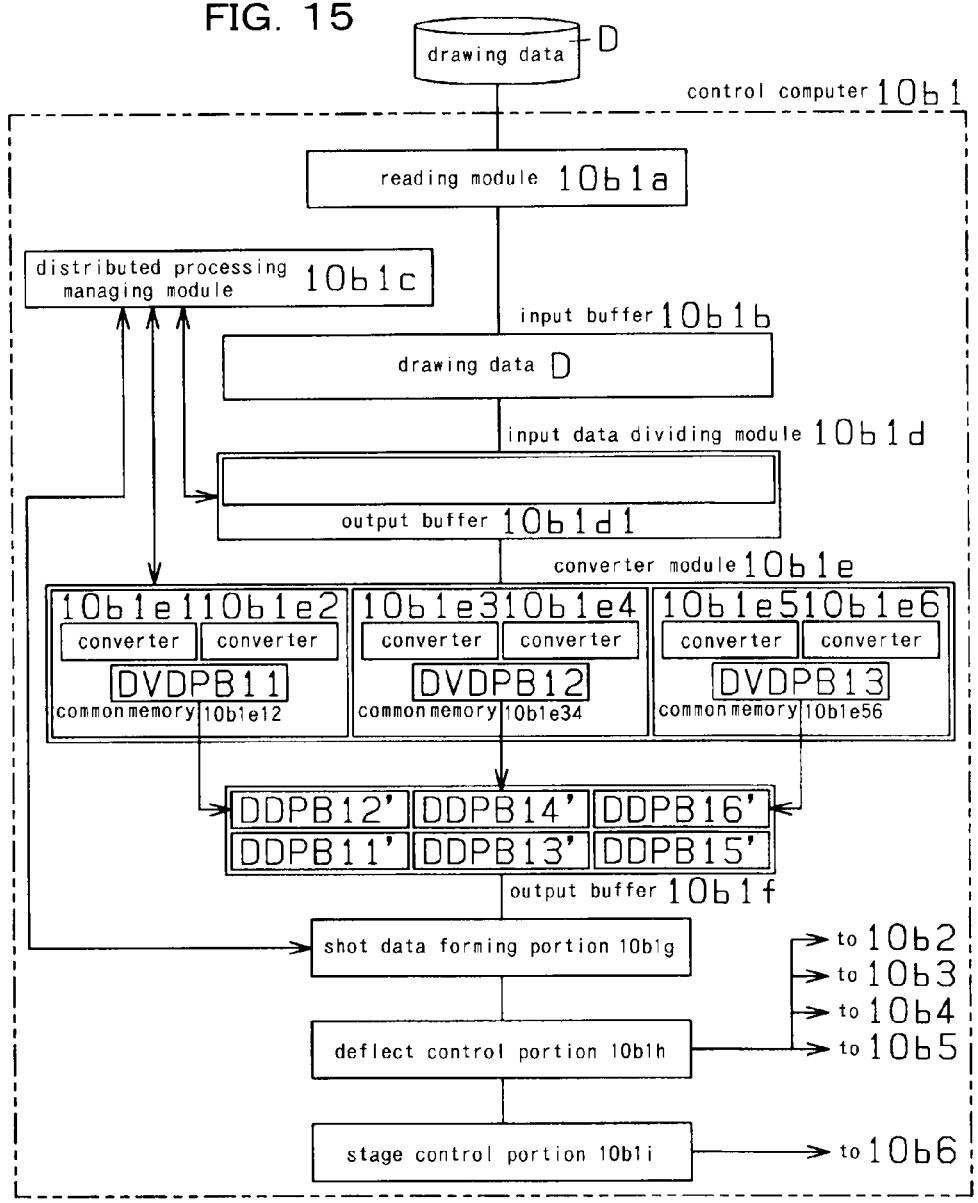

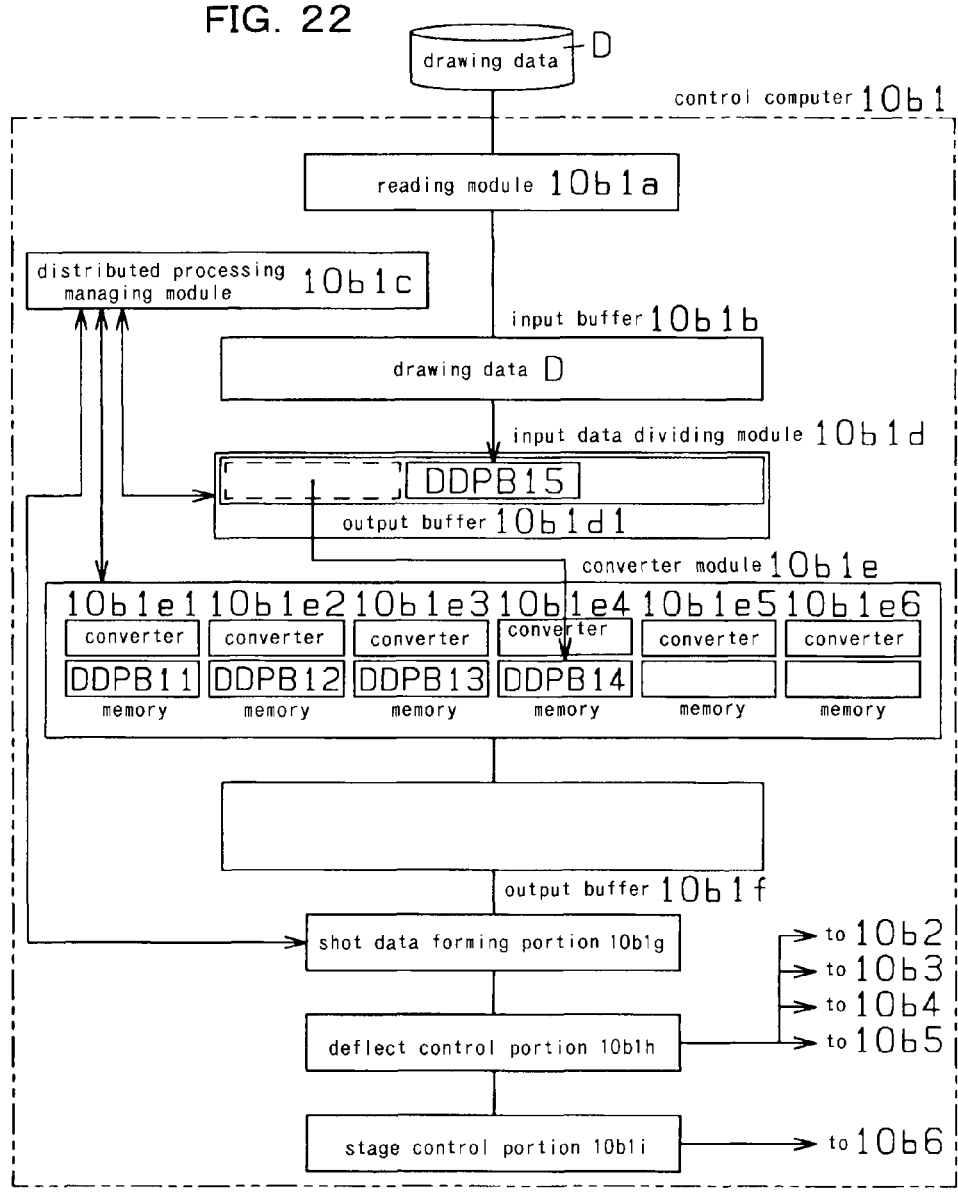

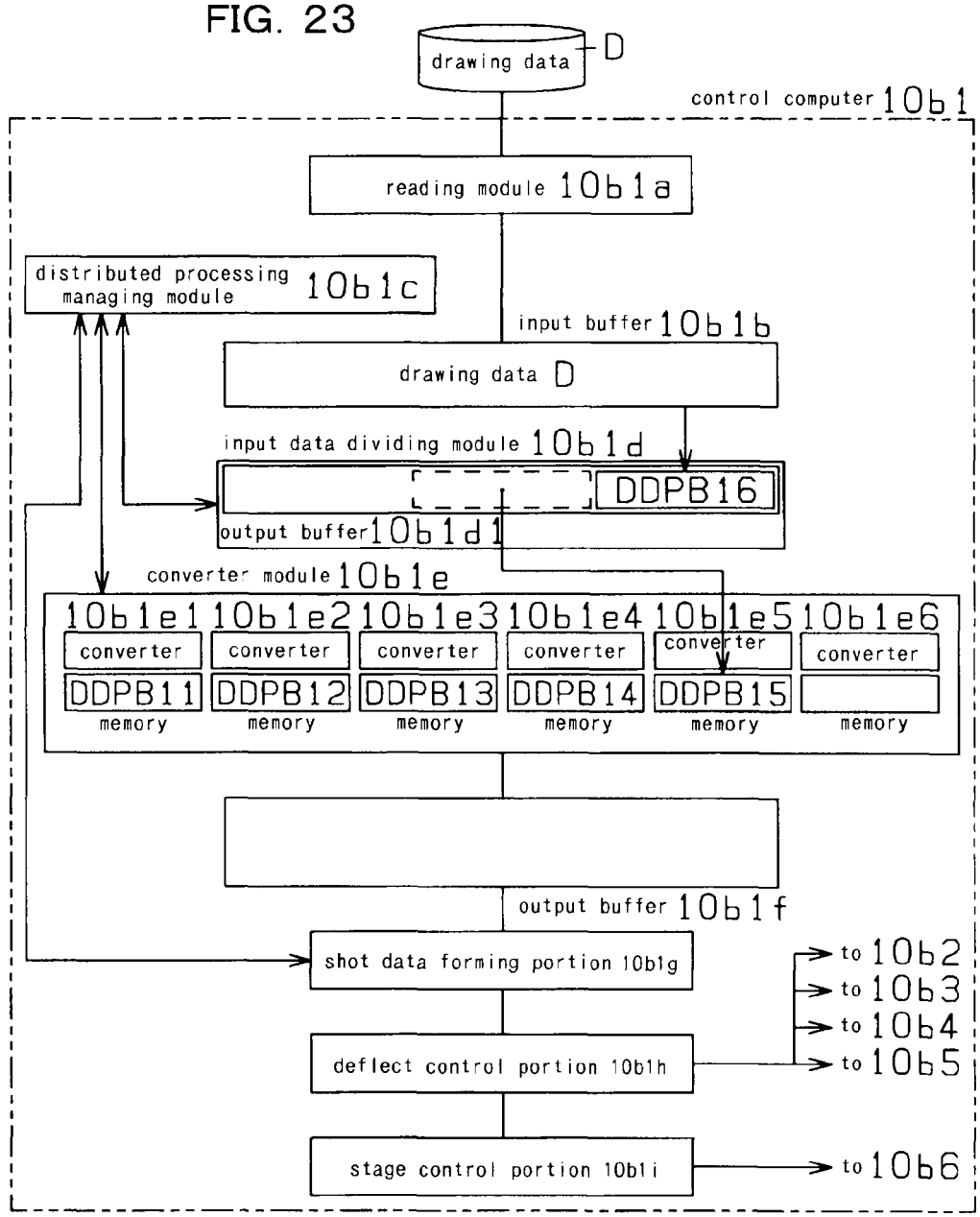

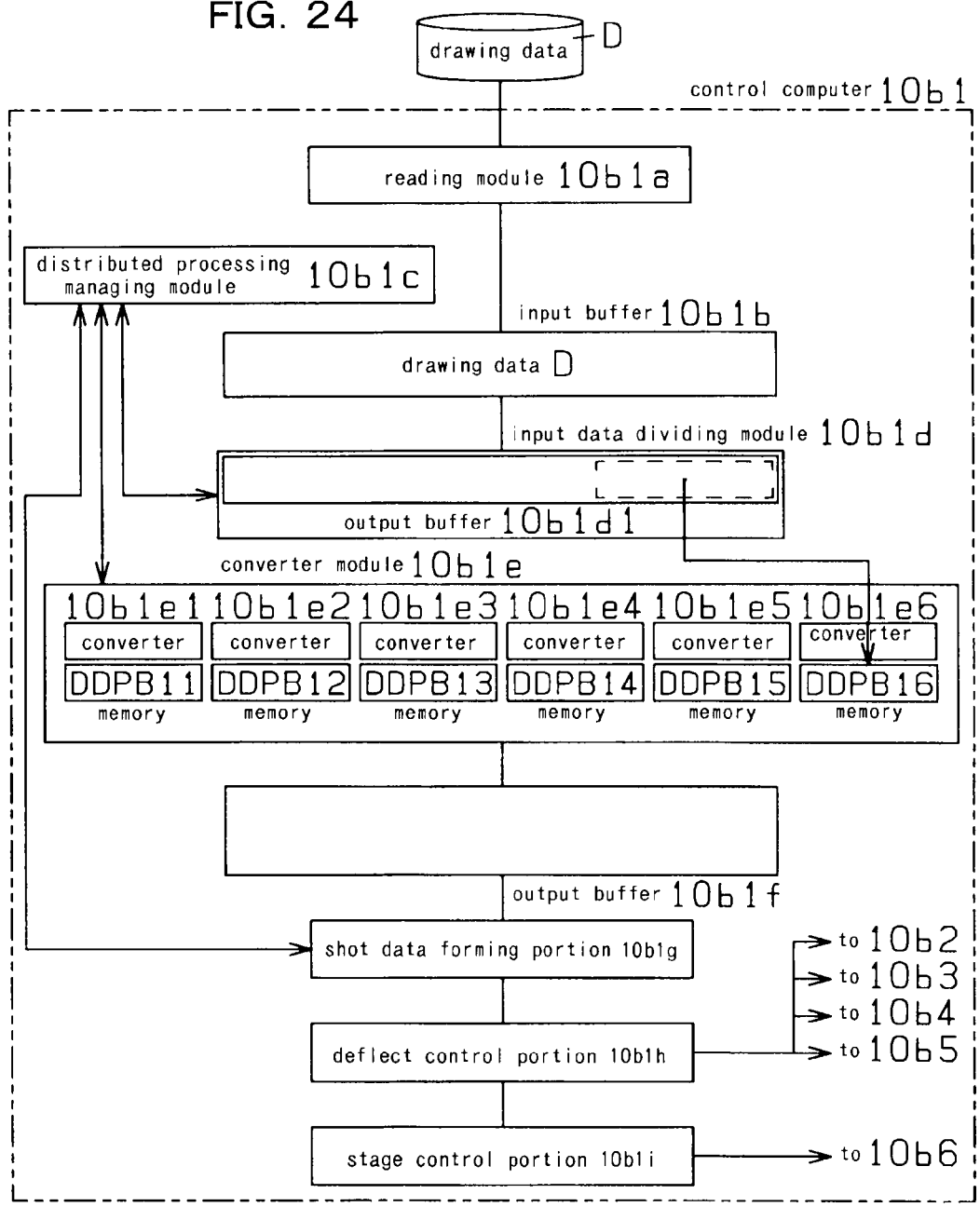

CHARGED PARTICLE BEAM DRAWING METHOD AND APPARATUS

CROSS-REFERENCE TO RELATED APPLICATION

This application is based upon and claims the benefit of priority from the prior Japanese Patent Application No. 2009-167179 filed on Jul. 15, 2009 in Japan, the entire contents of which are incorporated herein by reference.

BACKGROUND OF THE INVENTION

1. Field of the Invention

The present invention relates to a charged particle beam drawing method and apparatus for drawing patterns which correspond to figures included in a drawing data, in a drawing area on a workpiece by a charged particle beam.

2. Description of Related Art

As is known in the prior art, a charged particle beam drawing apparatus draws patterns corresponding to figures included in cells included in a drawing data which has at least figure hierarchy and cell hierarchy, in a drawing area on a workpiece, by a charged particle beam. For example, the charged particle beam drawing apparatus is described in Japanese Unexamined Patent Publication No. 2008-218767.

As described in Japanese Unexamined Patent Publication No. 2008-218767, after the drawing data corresponding to the drawing area on the workpiece is inputted to the charged particle beam drawing apparatus, the drawing data is transferred and stored to an input buffer in the charged particle beam drawing apparatus.

In the charged particle beam drawing apparatus described in Japanese Unexamined Patent Publication No. 2008-218767, rectangular stripe frames are formed by dividing the drawing area on the workpiece, and block frames are formed by dividing the stripe frames.

In the charged particle beam drawing apparatus described in Japanese Unexamined Patent Publication No. 2008-218767, a data corresponding to a block frame which is a part of the drawing data corresponding to the drawing area on the workpiece, is read from the input buffer by an input data dividing module (localizer, distributor) (see Japanese Unexamined Patent Publication No. 2009-64862 and Japanese Unexamined Patent Publication No. 2008-85248), and temporarily stored to an output buffer of the input data dividing module (localizer, distributor).

In the charged particle beam drawing apparatus described in Japanese Unexamined Patent Publication No. 2008-218767, a data corresponding to a block frame (data of block frame unit) is transferred from the output buffer of the input data dividing module (localizer, distributor) to one of converters which constitute a converter module.

In the charged particle beam drawing apparatus described in Japanese Unexamined Patent Publication No. 2008-218767, a data corresponding to a block frame transferred to the converter, is converted into a drawing apparatus internal format data which is an intermediate data for forming a shot data, by the converter, and in parallel, another data corresponding to another block frame transferred to another converter, is converted into another drawing apparatus internal format data by the converter.

In the charged particle beam drawing apparatus described in Japanese Unexamined Patent Publication No. 2008-218767, if a cell extends over a first block frame and a second block frame which is adjacent to the first block frame, a cell data is stored to the output buffer of the input data dividing module (localizer, distributor) as a part of a data of the first block frame, and the cell data is stored to the output buffer of the input data dividing module (localizer, distributor) as a part of a data of the second block frame.

Namely, in the charged particle beam drawing apparatus described in Japanese Unexamined Patent Publication No. 2008-218767, the cell data is repetitively stored to the output buffer of the input data dividing module (localizer, distributor) as the part of the data of the first block frame and as the part of the data of the second block frame.

Accordingly, in the charged particle beam drawing apparatus described in Japanese Unexamined Patent Publication No. 2008-218767, if a plurality of cell data are repetitively stored to the output buffer of the input data dividing module (localizer, distributor), it is necessary to increase the capacity of the output buffer of the input data dividing module (localizer, distributor), in order to avoid lack of the capacity of the output buffer of the input data dividing module (localizer, distributor).

In the charged particle beam drawing apparatus described in Japanese Unexamined Patent Publication No. 2008-218767, if the cell extends over the first block frame and the second block frame which is adjacent to the first block frame, the cell data is transferred from the output buffer of the input data dividing module (localizer, distributor) to a memory of a first converter as the part of the data of the first block frame, and the cell data is transferred from the output buffer of the input data dividing module (localizer, distributor) to a memory of a second converter as the part of the data of the second block frame.

Namely, in the charged particle beam drawing apparatus described in Japanese Unexamined Patent Publication No. 2008-218767, the cell data is repetitively transferred from the output buffer of the input data dividing module (localizer, distributor) as the part of the data of the first block frame and as the part of the data of the second block frame.

Accordingly, in the charged particle beam drawing apparatus described in Japanese Unexamined Patent Publication No. 2008-218767, if a plurality of cell data are repetitively transferred from the output buffer of the input data dividing module (localizer, distributor), transfer time of the plurality of cell data increases.

In the charged particle beam drawing apparatus described in Japanese Unexamined Patent Publication No. 2008-218767, if the cell extends over the first block frame and the second block frame which is adjacent to the first block frame, the cell data is stored to the memory of the first converter as the part of the data of the first block frame, and the cell data is stored to the memory of the second converter as the part of the data of the second block frame.

Accordingly, in the charged particle beam drawing apparatus described in Japanese Unexamined Patent Publication No. 2008-218767, if the plurality of cell data are repetitively stored to the memories of the converters, it is necessary to increase the capacity of the memories of the converters, in order to avoid lack of the capacity of the memories of the converters.

In a charged particle beam drawing apparatus described in Japanese Unexamined Patent Publication No. 2008-218857, a data corresponding to a group of small areas (a data of small areas group unit) which includes block frames, is read from an input buffer and is localized.

However, in the charged particle beam drawing apparatus described in Japanese Unexamined Patent Publication No. 2008-218857, a data of small areas group unit which is longer than a data corresponding to a block frame (a data of block frame unit), is converted into a drawing apparatus internal format data by one converter, and in parallel, another data of small areas group unit is converted into another drawing apparatus internal format data by another converter.

Namely, in the charged particle beam drawing apparatus described in Japanese Unexamined Patent Publication No. 2008-218857, longer time is required for a convert process than a charged particle beam drawing apparatus, wherein a data of block frame unit is converted into a drawing apparatus internal format data by one converter, and in parallel, another data of block frame unit is converted into another drawing apparatus internal format data by another converter.

Accordingly, in the charged particle beam drawing apparatus described in Japanese Unexamined Patent Publication No. 2008-218857, longer idle time of a converter from the end of convert process of the converter to the end of convert process of all converters is required than a charged particle beam drawing apparatus, wherein a data of block frame unit is converted into a drawing apparatus internal format data by one converter, and in parallel, another data of block frame unit is converted into another drawing apparatus internal format data by another converter.

SUMMARY OF THE INVENTION

An object of the present invention is to provide an charged particle beam drawing method and apparatus which can decrease the capacity of the output buffer and the memory, transfer time of data, and idle time of the converter.

In accordance with one aspect of the present invention, a charged particle beam drawing apparatus, comprising: a drawing portion for drawing patterns corresponding to figures included in cells included in a drawing data which has at least figure hierarchy and cell hierarchy, in a drawing area on a workpiece by a charged particle beam; an input buffer, wherein the drawing data inputted to the charged particle beam drawing apparatus and corresponding to all of the drawing area on the workpiece is stored to the input buffer; a dividing portion for dividing the drawing area on the workpiece into rectangular stripe frames and dividing the rectangular stripe frames into block frames; a virtual block frame forming portion for combining at least a first block frame and a second block frame into a virtual block frame, wherein the first block frame and the second block frame are a part of the block frames in one of the stripe frames, and wherein the first block frame is adjacent to the second block frame; an output buffer of an input data dividing module, wherein a data corresponding to the virtual block frame is read from the input buffer and is stored to the output buffer of the input data dividing module, and wherein the data corresponding to the virtual block frame is a part of the drawing data corresponding to all of the drawing area on the workpiece; a transferring portion for transferring the data corresponding to the virtual block frame from the output buffer of the input data dividing module to a common memory; a first converter for converting a data of a first figure into a first drawing apparatus internal format data, wherein the first figure is included in a cell extending over the first block frame and the second block frame, and is included in the first block frame, and wherein the data of the first figure is a part of the data corresponding to the virtual block frame transferred to the common memory; and a second converter for converting a data of a second figure into a second drawing apparatus internal format data in parallel with the first converter, wherein the second figure is included in the cell extending over the first block frame and the second block frame, and is included in the second block frame, and wherein the data of the second figure is a part of the data corresponding to the virtual block frame transferred to the common memory of the first converter corresponding to the first block frame and the second converter corresponding to the second block frame is provided.

In accordance with another aspect of the present invention, a charged particle beam drawing method, for drawing patterns corresponding to figures included in cells included in a drawing data which has at least figure hierarchy and cell hierarchy, in a drawing area on a workpiece by a charged particle beam, comprising: storing the drawing data corresponding to all of the drawing area on the workpiece, to an input buffer; dividing the drawing area on the workpiece into rectangular stripe frames and dividing the rectangular stripe frames into block frames; combining at least a first block frame and a second block frame into a virtual block frame, wherein the first block frame and the second block frame are a part of the block frames in one of the stripe frames, and wherein the first block frame is adjacent to the second block frame; reading a data corresponding to the virtual block frame from the input buffer and storing to an output buffer of an input data dividing module, wherein the data corresponding to the virtual block frame is a part of the drawing data corresponding to all of the drawing area on the workpiece; transferring the data corresponding to the virtual block frame from the output buffer of the input data dividing module to a common memory of a first converter corresponding to the first block frame and a second converter corresponding to the second block frame; converting a data of a first figure into a first drawing apparatus internal format data by the first converter, wherein the first figure is included in a cell extending over the first block frame and the second block frame, and is included in the first block frame, and wherein the data of the first figure is a part of the data corresponding to the virtual block frame transferred to the common memory; and converting a data of a second figure into a second drawing apparatus internal format data by the second converter in parallel with the first converter, wherein the second figure is included in the cell extending over the first block frame and the second block frame, and is included in the second block frame, and wherein the data of the second figure is a part of the data corresponding to the virtual block frame transferred to the common memory is provided.

Other and further objects, features and advantages of the invention will appear more fully from the following description.

BRIEF DESCRIPTION OF THE DRAWINGS

FIGS. 7A, 7B, 7C, 7D, 7E, 7F, 7G, 7H and 7I show an example of sequence of drawing of the pattern P1 corresponding to the figure FG1 included in the drawing data D by means of the charged particle beam 10$a$1$b$;

FIGS. 9 to 15 explain a convert process of the drawing data D in the charged particle beam drawing apparatus 10 of the first embodiment;

FIGS. 18 to 24 explain a convert process of the drawing data D in a charged particle beam drawing apparatus of the related art.

DETAILED DESCRIPTION OF THE INVENTION

Figure 1:
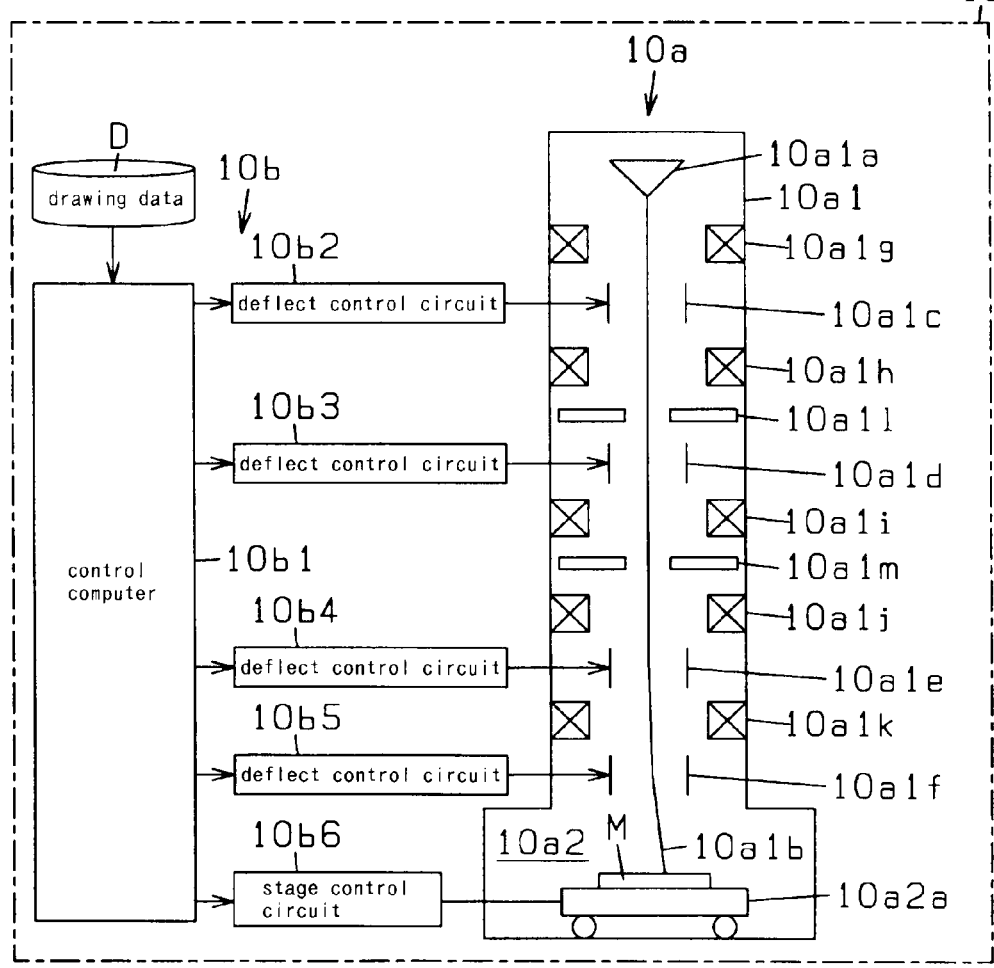
FIG. 1 is a schematic illustration of a first embodiment of a charged particle beam drawing apparatus 10 according to the present invention.
Figure 2:
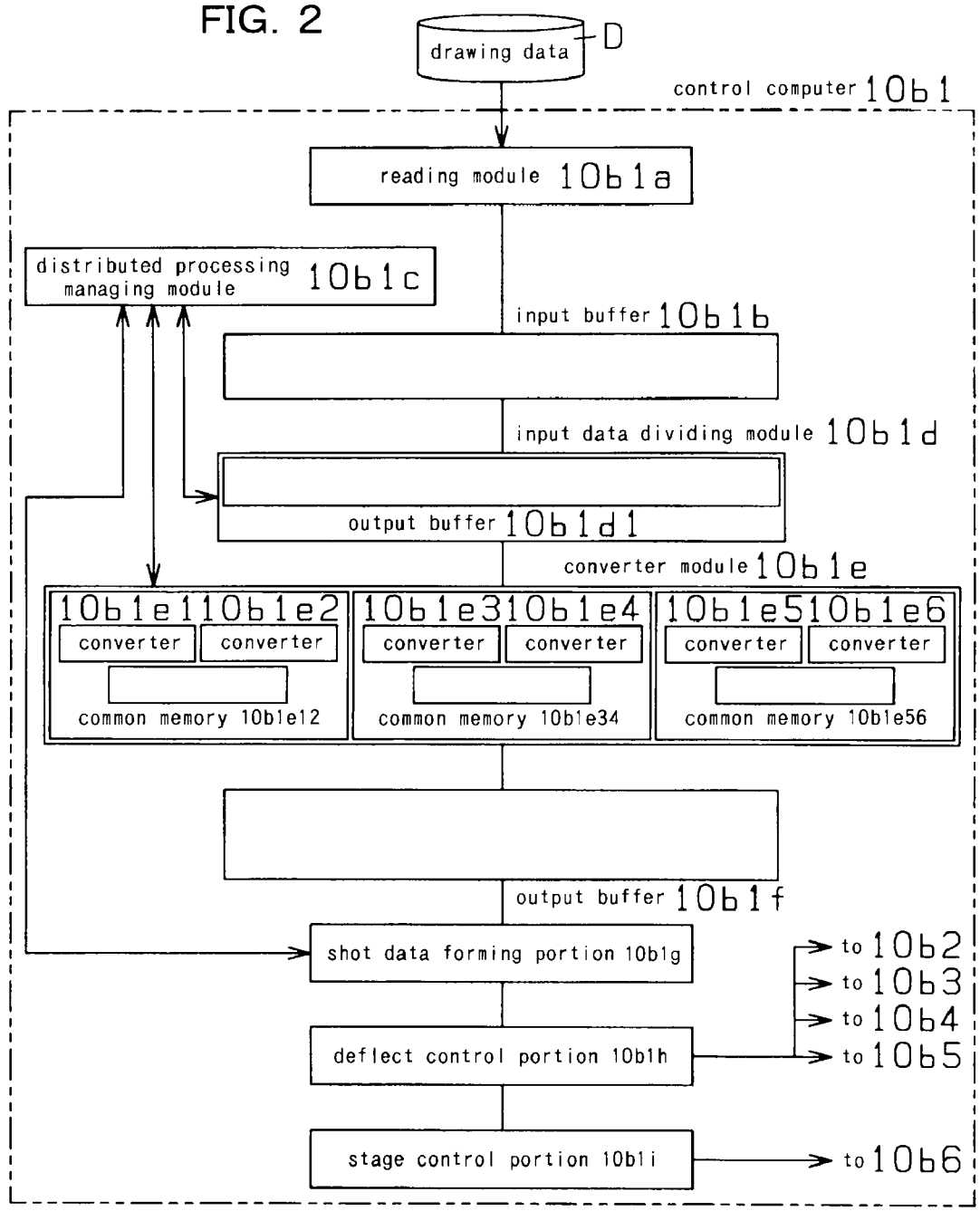
FIG. 2 shows the control computer 10$b$1 of the control portion 10$b$ of the charged particle beam drawing apparatus 10 of the first embodiment shown in FIG. 1, in detail.

FIG. 1 is a schematic illustration of a first embodiment of a charged particle beam drawing apparatus 10 according to the present invention. FIG. 2 shows the control computer 10$b$1 of the control portion 10$b$ of the charged particle beam drawing apparatus 10 of the first embodiment shown in FIG. 1, in detail. As shown in FIG. 1, the charged particle beam drawing apparatus 10 of the first embodiment has a drawing portion 10$a$ for drawing patterns on a workpiece M such as a musk (blank) and a wafer, by irradiating the workpiece M with a charged particle beam 10$a$1$b$.

In the charged particle beam drawing apparatus 10 of the first embodiment, an electron beam is used as the charged particle beam 10$a$1$b$. In the charged particle beam drawing apparatus 10 of a second embodiment, a charged particle beam such as an ion beam, except the electron beam can be used as the charged particle beam 10$a$1$b$.

In the charged particle beam drawing apparatus 10 of the first embodiment, as shown in FIG. 1, the drawing portion 10$a$ has a charged particle beam gun 10$a$1$a$, deflectors 10$a$1$c$, 10$a$1$d$, 10$a$1$e$, 10$a$1$f$ for deflecting the charged particle beam 10$a$1$b$ emitted from the charged particle beam gun 10$a$1$a$, and a movable stage 10$a$2$a$ for supporting the workpiece M. Patterns are drawn on the workpiece M by the charged particle beam 10$a$1$b$ deflected by the deflectors 10$a$1$c$, 10$a$1$d$, 10$a$1$e$, 10$a$1$f$.

Figure 5:
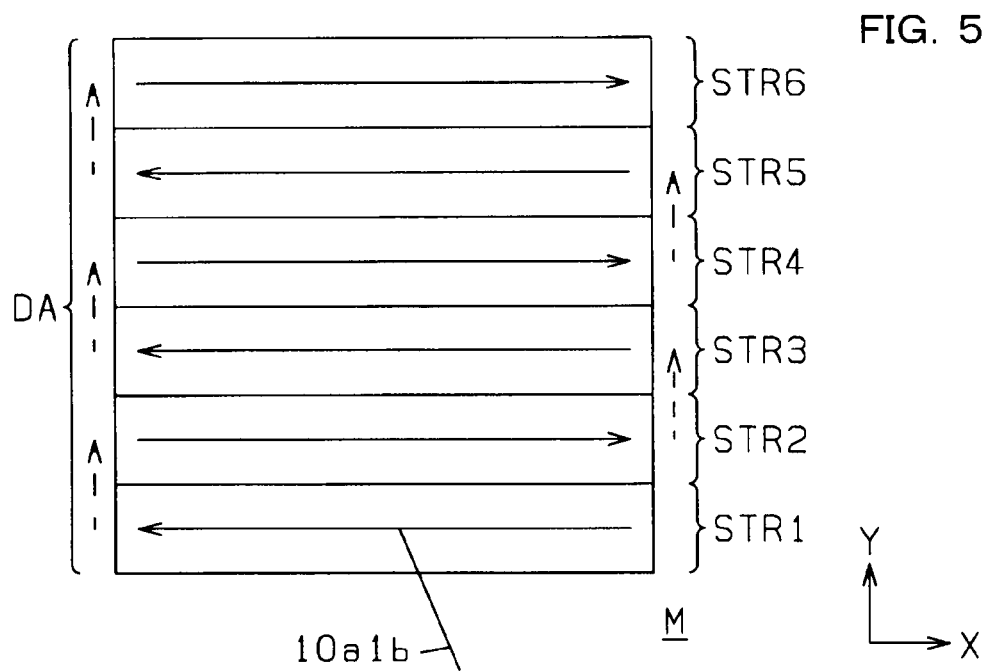
FIG. 5 explains a sequence of drawing of patterns corresponding to figures FG1, FG2 included in the drawing data D by means of the charged particle beam 10$a$1$b$.

In the charged particle beam drawing apparatus 10 of the first embodiment, as shown in FIG. 1, a drawing chamber 10$a$2 composes a part of the drawing portion 10$a$. The movable stage 10$a$2$a$ for supporting the workpiece M is placed in the drawing chamber 10$a$2. The stage 10$a$2$a$ is movable in X direction and movable in Y direction (X direction and Y direction are shown in FIG. 5).

In the charged particle beam drawing apparatus 10 of the first embodiment, as shown in FIG. 1, an optical column 10$a$1 composes a part of the drawing portion 10$a$. The charged particle beam gun 10$a$1$a$, the deflectors 10$a$1$c$, 10$a$1$d$, 10$a$1$e$, 10$a$1$f$, lenses 10$a$1$g$, 10$a$1$h$, 10$a$1$i$, 10$a$1$j$, 10$a$1$k$, a first forming aperture member 10$a$1$l$ and a second forming aperture member 10$a$1$m$ are placed in the optical column 10$a$1.

In the charged particle beam drawing apparatus 10 of the first embodiment, as shown in FIGS. 1 and 2, a drawing data D corresponding to all of a drawing area DA (see FIG. 5) on a workpiece M is inputted to the control computer 10$b$1, and then, the drawing data D is read by a reading module 10$b$1$a$ and stored to an input buffer 10$b$1$b$. Then, the drawing data D corresponding to all of the drawing area DA on the workpiece M is read and divided into plural data of small area unit by an input data dividing module 10$b$1$d$. Then, the plural data of small area unit are stored to an output buffer 10$b$1$d$1 of the input data dividing module 10$b$1$d$. Then, the plural data of small area unit are transferred to plural common memories 10$b$1$e$12, 10$b$1$e$34, 10$b$1$e$56 of a converter module 10$b$1$e$.

Then, in the charged particle beam drawing apparatus 10 of the first embodiment, as shown in FIGS. 1 and 2, a part of data of small area unit transferred to the common memory 10$b$1$e$12 of the converter module 10$b$1$e$ is converted into drawing apparatus internal format data by the converter 10$b$1$e$1, and a part of data of small area unit transferred to the common memory 10$b$1$e$12 of the converter module 10$b$1$e$ is converted into drawing apparatus internal format data by the converter 10$b$1$e$2. In parallel with the convert process of the converters 10$b$1$e$1, 10$b$1$e$2, a part of data of small area unit transferred to the common memory 10$b$1$e$34 of the converter module 10$b$1$e$ is converted into drawing apparatus internal format data by the converter 10$b$1$e$3, and a part of data of small area unit transferred to the common memory 10$b$1$e$34 of the converter module 10$b$1$e$ is converted into drawing apparatus internal format data by the converter 10$b$1$e$4. In parallel with the convert process of the converters 10$b$1$e$1, 10$b$1$e$2, 10$b$1$e$3, 10$b$1$e$4, a part of data of small area unit transferred to the common memory 10$b$1$e$56 of the converter module 10$b$1$e$ is converted into drawing apparatus internal format data by the converter 10$b$1$e$5, and a part of data of small area unit transferred to the common memory 10$b$1$e$56 of the converter module 10$b$1$e$ is converted into drawing apparatus internal format data by the converter 10$b$1$e$6.

Then, in the charged particle beam drawing apparatus 10 of the first embodiment, as shown in FIGS. 1 and 2, plural drawing apparatus internal format data of small area unit formed by the parallel convert process of the converters 10$b$1$e$1, 10$b$1$e$2, 10$b$1$e$3, 10$b$1$e$4, 10$b$1$e$5, 10$b$1$e$6 are stored to an output buffer 10$b$1$f$. Then, plural drawing apparatus internal format data of small area unit are transferred from the output buffer 10$b$1$f$ to a shot data forming portion 10$b$1$g$.

Then, in the charged particle beam drawing apparatus 10 of the first embodiment, as shown in FIGS. 1 and 2, plural drawing apparatus internal format data of small area unit transferred to the shot data forming portion 10$b$1$g$ are converted by plural convert portions (not shown) of the shot data forming portion 10$b$1$g$ in parallel, so that shot data for irradiating the workpiece M with the charged particle beam 10$a$1$b$ is formed in order to draw patterns on the workpiece M.

In the charged particle beam drawing apparatus 10 of the first embodiment, as shown in FIG. 2, the input data dividing module 10$b$1$d$, the converter module 10$b$1$e$, the shot data forming portion 10$b$1$g$ etc. are managed by a distributed processing managing module 10$b$1$c$.

Then, in the charged particle beam drawing apparatus 10 of the first embodiment, as shown in FIGS. 1 and 2, the shot data is transferred to a deflect control portion 10$b$1$h$. Then, the deflectors 10$a$1$c$, 10$a$1$d$, 10$a$1$e$, 10$a$1$f$ are controlled by the deflect control portion 10$b$1$h$ on the basis of the shot data. Accordingly, the charged particle beam 10$a$1$b$ emitted from the charged particle beam gun 10$a$1$a$ is applied to a predetermined position on the workpiece M.

Figure 3A:
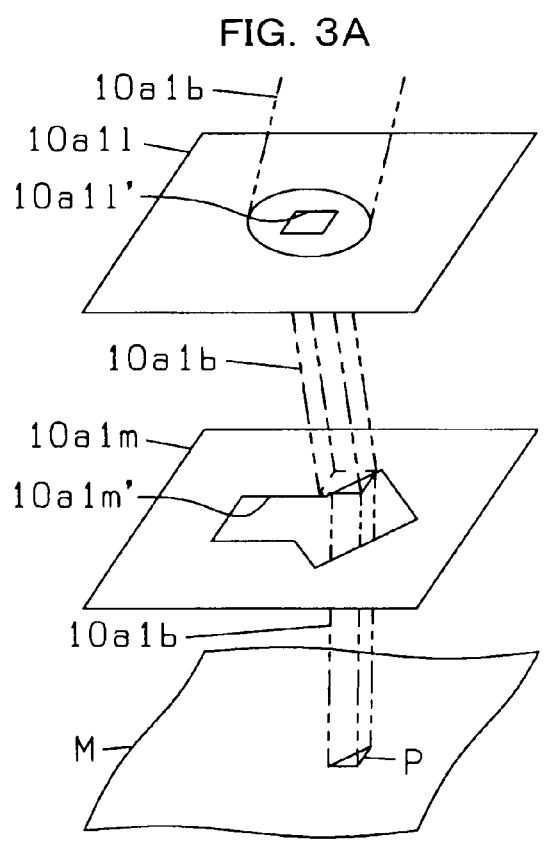
FIGS. 3A, 3B, 3C, 3D, 3E, 3F, 3G, 3H and 3I show examples of a pattern P which can be drawn on the workpiece M by a shot of the charged particle beam 10$a$1$b$ in the charged particle beam drawing apparatus 10 of the first embodiment.

In the charged particle beam drawing apparatus 10 of the first embodiment, as shown in FIGS. 1 and 2, the charged particle beam 10$a$1$b$ emitted from the charged particle beam gun 10$a$1$a$ is passed through an opening 10$a$1$l'$ (see FIG. 3A)

of the first forming aperture member 10a1l and the workpiece M is irradiated with the charged particle beam 10a1b, or the charged particle beam 10a1b emitted from the charged particle beam gun 10a1a is interrupted by a part of the first forming aperture member 10a1l except the opening 10a1l' and the workpiece M is not irradiated with the charged particle beam 10a1b, by controlling a blanking deflector 10a1c via a deflect control circuit 10b2 by means of the deflect control portion 10b1h on the basis of the shot data formed by the shot data forming potion 10b1g of the control computer 10b1 of the control portion 10b. In other words, in the charged particle beam drawing apparatus 10 of the first embodiment, a beam irradiate time of the charged particle beam 10a1b can be controlled by controlling the blanking deflector 10a1c.

In the charged particle beam drawing apparatus 10 of the first embodiment, as shown in FIGS. 1 and 2, a beam size changing deflector 10a1d is controlled via a deflect control circuit 10b3 by the deflect control portion 10b1h on the basis of the shot data formed by the shot data forming potion 10b1g of the control computer 10b1 of the control portion 10b, so that the charged particle beam 10a1b passed through the opening 10a1l' (see FIG. 3A) of the first forming aperture member 10a1l is deflected by the beam size changing deflector 10a1d. And then, all of the charged particle beam 10a1b or a part of the charged particle beam 10a1b deflected by the beam size changing deflector 10a1d, is passed through an opening 10a1m' (see FIG. 3A) of the second forming aperture member 10a1m. In other words, in the charged particle beam drawing apparatus 10 of the first embodiment, size or shape of the charged particle beam 10a1b applied to the workpiece M can be adjusted by adjusting deflecting amount or deflecting direction of the charged particle beam 10a1b deflected by the beam size changing deflector 10a1d.

FIGS. 3A, 3B, 3C, 3D, 3E, 3F, 3G, 3H and 3I show examples of a pattern P which can be drawn on the workpiece M by a shot of the charged particle beam 10a1b in the charged particle beam drawing apparatus 10 of the first embodiment. In the charged particle beam drawing apparatus 10 of the first embodiment, as shown in FIGS. 1 and 3A, when the pattern P (see FIG. 3A) is drawn on the workpiece M by the charged particle beam 10a1b, apart of the charged particle beam 10a1b emitted from the charged particle beam gun 10a1a (see FIG. 1) is passed through the square opening 10a1l' (see FIG. 3A) of the first forming aperture member 10a1l. So that, a horizontal sectional shape of the charged particle beam 10a1b passed through the opening 10a1l' of the first forming aperture member 10a1l is almost square. And then, all of the charged particle beam 10a1b or a part of the charged particle beam 10a1b passed through the opening 10a1l' of the first forming aperture member 10a1l is passed through the opening 10a1m' (see FIG. 3A) of the second forming aperture member 10a1m.

In the charged particle beam drawing apparatus 10 of the first embodiment, as shown in FIGS. 1 and 3A, a horizontal sectional shape of the charged particle beam 10a1b passed through the opening 10a1m' (see FIG. 3A) of the second forming aperture member 10a1m can be rectangular (square or oblong) or triangular, by deflecting the charged particle beam 10a1b passed through the opening 10a1l' of the first forming aperture member 10a1l by means of the deflector 10a1d (see FIG. 1).

In the charged particle beam drawing apparatus 10 of the first embodiment, as shown in FIGS. 1 and 3A, the pattern P (see FIG. 3A) having the same shape as the horizontal sectional shape of the charged particle beam 10a1b passed through the opening 10a1m' (see FIG. 3A) of the second forming aperture member 10a1m can be drawn on the workpiece M, by applying the charged particle beam 10a1b passed through the opening 10a1m' (see FIG. 3A) of the second forming aperture member 10a1m, to a predetermined position on the workpiece M, for a predetermined time.

In the charged particle beam drawing apparatus 10 of the first embodiment, as shown in FIGS. 1 and 3A, a largest pattern P (see FIG. 3B) can be drawn on the workpiece M by a shot of the charged particle beam 10a1b by means of controlling deflecting amount and deflecting direction of the charged particle beam 10a1b passed through the opening 10a1l' (see FIG. 3A) of the first forming aperture member 10a1l and then deflected by the deflector 10a1d (see FIG. 1). In the charged particle beam drawing apparatus 10 of the first embodiment, as shown in FIGS. 1 and 3A, a rectangular (square or oblong) pattern P (see FIGS. 3C, 3D and 3E) which is smaller than the largest pattern P shown in FIG. 3B can be drawn on the workpiece M by a shot of the charged particle beam 10a1b. In the charged particle beam drawing apparatus 10 of the first embodiment, as shown in FIGS. 1 and 3A, a triangular pattern P (see FIGS. 3F, 3G, 3H and 3I) which is smaller than the largest pattern P shown in FIG. 3B can be drawn on the workpiece M by a shot of the charged particle beam 10a1b.

In the charged particle beam drawing apparatus 10 of the first embodiment, as shown in FIGS. 1 and 2, the main deflector 10a1e is controlled via a deflect control circuit 10b4 by the deflect control portion 10b1h on the basis of the shot data formed by the shot data forming portion 10b1h of the control computer 10b1 of the control portion 10b, so that the charged particle beam 10a1b passed through the opening 10a1m' (see FIG. 3A) of the second forming aperture member 10a1m is deflected by the main deflector 10a1e.

In the charged particle beam drawing apparatus 10 of the first embodiment, as shown in FIGS. 1 and 2, the sub-deflector 10a1f is controlled via a deflect control circuit 10b5 by the deflect control portion 10b1h on the basis of the shot data formed by the shot data forming portion 10b1h of the control computer 10b1 of the control portion 10b, so that the charged particle beam 10a1b deflected by the main deflector 10a1e is deflected by the sub-deflector 10a1f. In the charged particle beam drawing apparatus 10 of the first embodiment, the irradiate position of the charged particle beam 10a1b on the workpiece M can be adjusted by adjusting deflecting amount and deflecting direction of the charged particle beam 10a1b by means of the main deflector 10a1e and the sub-deflector 10a1f.

In the charged particle beam drawing apparatus 10 of the first embodiment, as shown in FIGS. 1 and 2, movement of the movable stage 10a2a is controlled via a stage control circuit 10b6 by a stage control portion 10b1i on the basis of the shot data formed by the shot data forming portion 10b1h of the control computer 10b1 of the control portion 10b.

In the example shown in FIGS. 1 and 2, a CAD data (layout data, design data) prepared by a designer such as a semiconductor integrated circuit designer, is converted into the drawing data D of the format of the charged particle beam drawing apparatus 10. And then, the drawing data D is inputted to the control computer 10b1 of the control portion 10b of the charged particle beam drawing apparatus 10. In general, a plurality of small patterns are included in the CAD data (layout data, design data), so that the amount of the CAD data (layout data, design data) is very large. In general, after the CAD data (layout data, design data) is converted into a different format data, the amount of the data increases. Therefore, in order to compress the amount of the drawing data D, the drawing data D inputted to the control computer 10b1 of the control portion 10b of the charged particle beam drawing apparatus 10 has a hierarchical structure.

Figure 4:
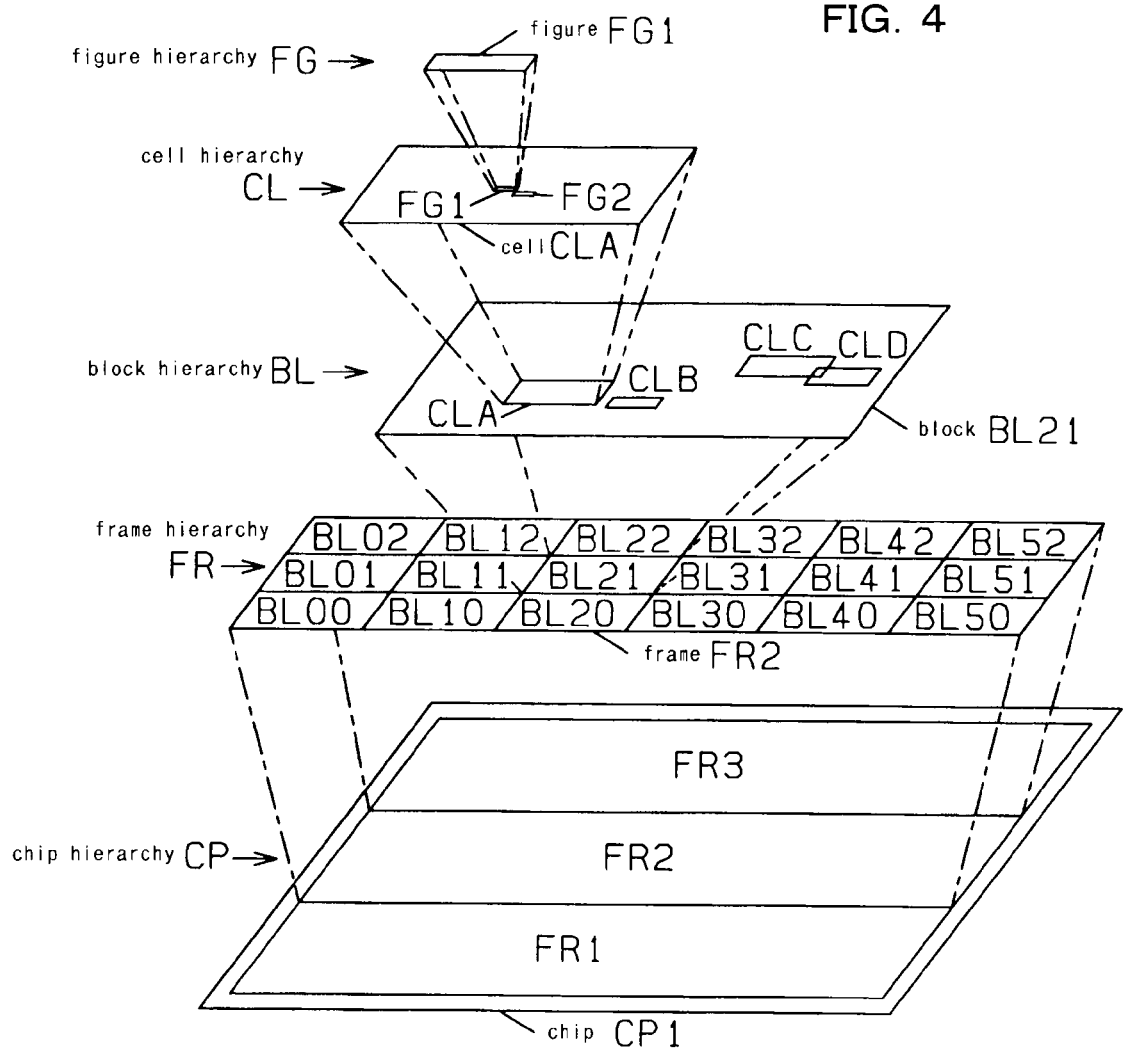
FIG. 4 shows an example of the drawing data D shown in FIGS. 1 and 2.

FIG. 4 shows an example of the drawing data D shown in FIGS. 1 and 2. In the example shown in FIG. 4, the drawing data D (see FIGS. 1 and 2) applied to the charged particle beam drawing apparatus 10 of the first embodiment, has a chip hierarchy CP, a frame hierarchy FR which is lower than the chip hierarchy CP, a block hierarchy BL which is lower than the frame hierarchy FR, a cell hierarchy CL which is lower than the frame hierarchy FR, and a figure hierarchy FG which is lower than the cell hierarchy CL.

In the example shown in FIG. 4, a chip CP1 is one of elements of the chip hierarchy CP, and corresponds to three frames FR1, FR2, FR3. The frame FR2 is one of elements of the frame hierarchy FR, and corresponds to eighteen blocks BL00, BL10, BL20, BL30, BL40, BL50, BL01, BL11, BL21, BL31, BL41, BL51, BL02, BL12, BL22, BL32, BL42, BL52. The block BL21 is one of elements of the block hierarchy BL, and corresponds to cells CLA, CLB, CLC, CLD. The cell CLA is one of elements of the cell hierarchy CL, and corresponds to a plurality of figures FG1, FG2. Each of the figures FG1, FG2 is one of elements of the figure hierarchy FG.

In the charged particle beam drawing apparatus 10 of the first embodiment, as shown in FIGS. 1, 2 and 4, the charged particle beam 10a1b (see FIG. 1) draws patterns on the workpiece M (see FIG. 1), and the patterns correspond to the plurality of figures FG1, FG2 (see FIG. 4) in the figure hierarchy FG (see FIG. 4) in the drawing data D (see FIGS. 1 and 2).

FIG. 5 explains a sequence of drawing of patterns corresponding to figures FG1, FG2 included in the drawing data D by means of the charged particle beam 10a1b. In an example shown in FIG. 5, the drawing area DA on the workpiece M is virtually divided into six belt-shaped (rectangular) stripe frames STR1, STR2, STR3, STR4, STR5 and STR6.

In the example shown in FIG. 5, the charged particle beam 10a1b is scanned in the stripe STR1 from plus side (right side of FIG. 5) of X axis to minus side (left side of FIG. 5) of X axis, so that patterns corresponding to the plurality of figures (not shown) included in the drawing data D (see FIGS. 1 and 2) are drawn in the stripe frame STR1 on the workpiece M by the charged particle beam 10a1b. Then, the charged particle beam 10a1b is scanned in the stripe frame STR2 from minus side (left side of FIG. 5) of X axis to plus side (right side of FIG. 5) of X axis, so that patterns corresponding to the plurality of figures (not shown) included in the drawing data D (see FIGS. 1 and 2) are drawn in the stripe frame STR2 on the workpiece M by the charged particle beam 10a1b. Then, similarly, patterns P1, P2 (see FIG. 6) corresponding to the plurality of figures FG1, FG2 (see FIG. 4) included in the drawing data D (see FIGS. 1 and 2) are drawn in the stripe frames STR3, STR4, STR5 and STR6 on the workpiece M by the charged particle beam 10a1b.

In detail, in the example shown in FIG. 5, when the patterns are drawn in the stripe frame STR1 on the workpiece M by the charged particle beam 10a1b, the movable stage 10a2a (see FIG. 1) is controlled via the stage control circuit 10b6 (see FIG. 1) by the stage control portion 10b1i (see FIG. 2) of the control computer 10b1 (see FIGS. 1 and 2) of the control portion 10b (see FIG. 1), so that the movable stage 10a2a is moved from minus side (left side of FIG. 5) of X axis to plus side (right side of FIG. 5) of X axis. Then, before the patterns are drawn in the stripe frame STR2 (see FIG. 5) on the workpiece M by the charged particle beam 10a1b, the movable stage 10a2a is controlled via the stage control circuit 10b6 by the stage control portion 10b1i of the control computer 10b1 of the control portion 10b, so that the movable stage 10a2a is moved from plus side (upper side of FIG. 5) of Y axis to mines side (lower side of FIG. 5) of Y axis.

Then, in the example shown in FIG. 5, when the patterns are drawn in the stripe frame STR2 on the workpiece M by the charged particle beam 10a1b, the movable stage 10a2a (see FIG. 1) is controlled via a stage control circuit 10b6 (see FIG. 1) by the stage control portion 10b1i (see FIG. 2) of the control computer 10b1 (see FIGS. 1 and 2) of the control portion 10b (see FIG. 1), so that the movable stage 10a2a is moved from plus side (right side of FIG. 5) of X axis to mines side (left side of FIG. 5) of X axis.

Figure 6:
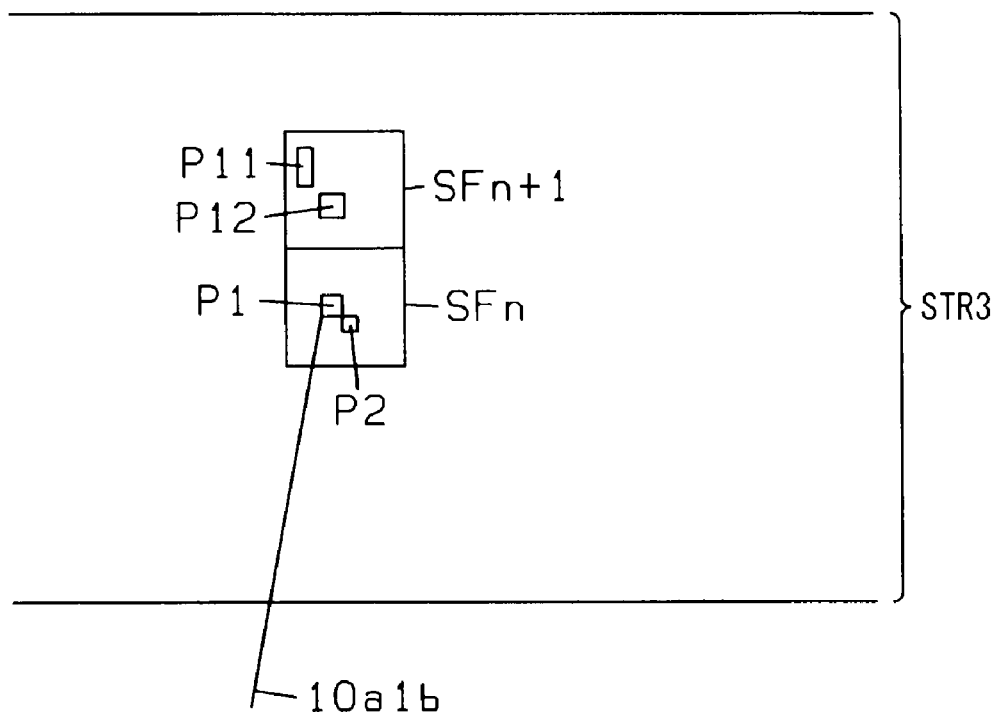
FIG. 6 explains an example of sequence of drawing of patterns P1, P2 corresponding to figures FG1, FG2 included in the drawing data D by means of the charged particle beam 10$a$1$b$ in detail.

FIG. 6 explains an example of sequence of drawing of patterns P1, P2 corresponding to figures FG1, FG2 included in the drawing data D by means of the charged particle beam 10a1b in detail.

In an example shown in FIG. 6, each of the stripe frames STR1, STR2, STR3, STR4, STR5 and STR6 (see FIG. 5) on the workpiece M (see FIG. 5) is divided into rectangular virtual areas called subfields SFn, SFn+1. In detail, in the example shown in FIG. 6, when the pattern P1 corresponding to the figure FG1 (see FIG. 4) included in the drawing data D (see FIGS. 1 and 2) is drawn by the charged particle beam 10a1b, the main deflector 10a1e (see FIG. 1) is controlled via the deflect control circuit 10b4 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that the charged particle beam 10a1b is applied in the subfield SFn.

Then, in the example shown in FIG. 6, the sub-deflector 10a1f (see FIG. 1) is controlled via the deflect control circuit 10b5 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that the pattern P1 is drawn by the charged particle beam 10a1b when control of the main deflector 10a1e is completed (when settling time of the main deflector 10a1e passes). Then, the blanking deflector 10a1c (see FIG. 1) is controlled via the deflect control circuit 10b2 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that irradiation of the charged particle beam 10a1b for drawing the pattern P1 is started when control of the sub-deflector 10a1f is completed (when settling time of the sub-deflector 10a1f passes).

Then, in the example shown in FIG. 6, the blanking deflector 10a1c (see FIG. 1) is controlled via the deflect control circuit 10b2 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that irradiation of the charged particle beam 10a1b is stopped when drawing of the pattern P1 by the charged particle beam 10a1b is completed. Then, the sub-deflector 10a1f (see FIG. 1) is controlled via the deflect control circuit 10b5 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that the pattern P2 is drawn by the charged particle beam 10a1b. Namely, the drawing of the pattern P2 is performed in the same way as the drawing of the pattern P1.

Then, in the example shown in FIG. 6, the main deflector 10a1e (see FIG. 1) is controlled via the deflect control circuit 10b4 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that the charged particle beam 10a1b is applied in the subfield SFn+1 when drawing of all of the patterns P1, P2 in the subfield SFn by the charged particle beam 10a1b is completed.

Then, in the example shown in FIG. 6, the sub-deflector 10a1f (see FIG. 1) is controlled via the deflect control circuit 10b5 (see FIG. 1) by the deflect control portion 10b1h (see FIG. 2) on the basis of the shot data formed by the shot data forming portion 10b1g (see FIG. 2) of the control computer 10b1 (see FIGS. 2. 1 and 2) of the control portion 10b (see FIG. 1), so that a pattern P11 is drawn by the charged particle beam 10a1b when control of the main deflector 10a1e is completed (when settling time of the main deflector 10a1e passes). Namely, the drawing of the pattern P11 is performed in the same way as the drawing of the patterns P1, P2.

Then, in the example shown in FIG. 6, the blanking deflector 10a1c (see FIG. 1) is controlled via the deflect control circuit 10b2 (see FIG. 1) by the deflect control portion 10b1h (see FIG. 2) on the basis of the shot data formed by the shot data forming portion 10b1h (see FIG. 2) of the control computer 10b1 (see FIGS. 2. 1 and 2) of the control portion 10b (see FIG. 1), so that irradiation of the charged particle beam 10a1b is stopped when drawing of the pattern P11 by the charged particle beam 10a1b is completed. Then, the sub-deflector 10a1f (see FIG. 1) is controlled via the deflect control circuit 10b5 (see FIG. 1) by the deflect control portion 10b1h (see FIG. 2) on the basis of the shot data formed by the shot data forming portion 10b1g (see FIG. 2) of the control computer 10b1 (see FIGS. 1 and 2) of the control portion 10b (see FIG. 1), so that a pattern P12 is drawn by the charged particle beam 10a1b. Namely, the drawing of the pattern P12 is performed in the same way as the drawing of the patterns P1, P2, P11.

FIGS. 7A, 7B, 7C, 7D, 7E, 7F, 7G, 7H and 7I show an example of sequence of drawing of the pattern P1 corresponding to the figure FG1 included in the drawing data D by means of the charged particle beam 10a1b. In detail, FIGS. 7A, 7B, 7C, 7D, 7E, 7F, 7G, 7H and 7I explain the example of the number of the shots of the charged particle beam 10a1b for drawing of the pattern P1 corresponding to the figure FG1 included in the drawing data D in the charged particle beam drawing apparatus 10 of the first embodiment.

Figure 3B:
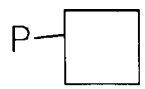
Figure 3C:
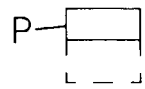
Figure 3D:
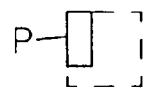
Figure 3E:
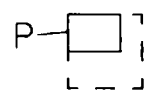
Figure 3F:
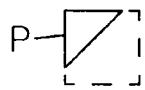
Figure 3G:
Figure 3H:
Figure 3I:
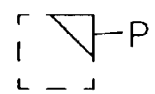

In the charged particle beam drawing apparatus 10 of the first embodiment, as shown in FIGS. 7A, 7B, 7C, 7D, 7E, 7F, 7G, 7H and 7I, more than one shots of the charged particle beam 10a1b (see FIG. 3A) is performed, if the pattern P1 (see FIG. 6) corresponding to the figure FG1 (see FIG. 4) included in the drawing data D (see FIGS. 1 and 2) is larger than the largest pattern P (see FIG. 3B). In other words, in the charged particle beam drawing apparatus 10 of the first embodiment, if the pattern P1 (see FIG. 6) corresponding to the figure FG1 (see FIG. 4) included in the drawing data D (see FIGS. 1 and 2) is larger than the largest pattern P (see FIG. 3B), the shot data forming portion 10b1g (see FIG. 2) of the control computer 10b1 (see FIGS. 1 and 2) of the control portion 10b (see FIG. 1) divides the figure FG1 (see FIG. 4) included in the drawing data D (see FIGS. 1 and 2) into small figures (not shown) in the drawing data D, the small figures corresponding to patterns P1a, P1b, P1c, P1d, P1e, P1f, P1g, P1h and P1i (see FIGS. 7A, 7B, 7C, 7D, 7E, 7F, 7G, 7H and 7I). Namely, the shot data forming portion 10b1g (see FIG. 2) forms a shot data. In general, this procedure is called shot division or figure division.

In the example shown in FIGS. 7A, 7B, 7C, 7D, 7E, 7F, 7G, 7H and 7I, as shown in FIG. 7A, a pattern P1a which has the same shape as the largest pattern P (see FIG. 3B) is drawn on the workpiece M by a first shot of the charged particle beam 10a1b (see FIG. 3A).

In detail, in the example shown in FIGS. 7A, 7B, 7C, 7D, 7E, 7F, 7G, 7H and 7I, the sub-deflector 10a1f (see FIG. 1) is controlled via the deflect control circuit 10b5 (see FIG. 1) by the deflect control portion 10b1h (see FIG. 2) on the basis of the shot data, so that the pattern P1a (see FIG. 7A) is drawn by the first shot of the charged particle beam 10a1b when control of the main deflector 10a1e (see FIG. 1) by the deflect control portion 10b1h (see FIG. 2) of the control computer 10b1 (see FIGS. 1 and 2) of the control portion 10b (see FIG. 1) is completed (when settling time of the main deflector 10a1e passes) in order to place the charged particle beam 10a1b (see FIG. 3A) in the subfield SFn (see FIG. 6).

Then, the blanking deflector 10a1c (see FIG. 1) is controlled via the deflect control circuit 10b2 (see FIG. 1) by the deflect control portion 10b1h (see FIG. 2) on the basis of the shot data D, so that the shot of the charged particle beam 10a1b (FIG. 3A) for drawing the pattern P1a (see FIG. 7A) is started when control of the sub-deflector 10a1f (see FIG. 1) by the deflect control portion 10b1h (see FIG. 2) of the control computer 10b1 (see FIGS. 1 and 2) of the control portion 10b (see FIG. 1) is completed (when settling time of the sub-deflector 10a1f passes). Also, the beam size changing deflector 10a1d (see FIG. 1) is controlled via the deflect control circuit 10b3 (see FIG. 1) by the deflect control portion 10b1h (see FIG. 2) on the basis of the shot data, so that the charged particle beam 10a1b which has a horizontal sectional shape for drawing the pattern P1a (see FIG. 7A) is applied when control of the sub-deflector 10a1f (see FIG. 1) by the deflect control portion 10b1h (see FIG. 2) of the control computer 10b1 (see FIGS. 1 and 2) of the control portion 10b (see FIG. 1) is completed (when settling time of the sub-deflector 10a1f passes).

Then, the blanking deflector 10a1c (see FIG. 1) is controlled via the deflect control circuit 10b2 (see FIG. 1) by the deflect control portion 10b1h (see FIG. 2) of the control computer 10b1 (see FIGS. 1 and 2) of the control portion 10b (see FIG. 1) on the basis of the shot data, so that irradiation of the charged particle beam 10a1b is stopped when beam irradiate time of the charged particle beam 10a1b (see FIG. 3A) for drawing of the pattern P1a (see FIG. 7A) passes.

Then, in the example shown in FIGS. 7A, 7B, 7C, 7D, 7E, 7F, 7G, 7H and 7I, as shown in FIG. 7B, a pattern P1b which has the same shape as the largest pattern P (see FIG. 3B) is drawn on the workpiece M by a second shot of the charged particle beam 10a1b (see FIG. 3A). Then, as shown in FIG. 7C, a pattern P1c which is smaller than the largest pattern P (see FIG. 3B) is drawn on the workpiece M by a third shot of the charged particle beam 10a1b (see FIG. 3A).

Then, in the example shown in FIGS. 7A, 7B, 7C, 7D, 7E, 7F, 7G, 7H and 7I, as shown in FIG. 7D, a pattern P1d which has the same shape as the largest pattern P (see FIG. 3B) is drawn on the workpiece M by a forth shot of the charged particle beam 10a1b (see FIG. 3A). Then, as shown in FIG. 7E, a pattern P1e which has the same shape as the largest pattern P (see FIG. 3B) is drawn on the workpiece M by a fifth shot of the charged particle beam 10a1b (see FIG. 3A). Then, as shown in FIG. 7F, a pattern P1f which is smaller than the largest pattern P (see FIG. 3B) is drawn on the workpiece M by a sixth shot of the charged particle beam 10a1b (see FIG. 3A).

Then, in the example shown in FIGS. 7A, 7B, 7C, 7D, 7E, 7F, 7G, 7H and 7I, as shown in FIG. 7G, a pattern P1g which is smaller than the largest pattern P (see FIG. 3B) is drawn on the workpiece M by a seventh shot of the charged particle beam 10a1b (see FIG. 3A). Then, as shown in FIG. 7H, a pattern P1h which is smaller than the largest pattern P (see FIG. 3B) is drawn on the workpiece M by a eighth shot of the charged particle beam 10a1b (see FIG. 3A). Then, as shown in FIG. 7I, a pattern P1i which is smaller than the largest pattern P (see FIG. 3B) is drawn on the workpiece M by a ninth shot of the charged particle beam 10a1b (see FIG. 3A).

Accordingly, in the example shown in FIGS. 7A, 7B, 7C, 7D, 7E, 7F, 7G, 7H and 7I, the pattern P1 corresponding to the figure FG1 (see FIG. 4) included in the drawing data D (see FIGS. 1 and 2) is drawn on the workpiece M by the charged particle beam 10a1b (see FIG. 3A).

In the example shown in FIGS. 7A, 7B, 7C, 7D, 7E, 7F, 7G, 7H and 7I, in order to explain that nine times shots of the charged particle beam 10a1b (see FIG. 3A) are necessary to draw the pattern P1 on the workpiece M, and that four times shots of the charged particle beam 10a1b (see FIG. 3A) for drawing the patterns P1a, P1b, P1d, P1e which respectively has the same shape as the largest pattern P (see FIG. 3B) are not enough to draw the pattern P1 on the workpiece M, shots of the charged particle beam 10a1b are divided into four times shots of the charged particle beam 10a1b for drawing the patterns P1a, P1b, P1d, P1e which respectively have the same shape as the largest pattern P (see FIG. 3B), and five times shots of the charged particle beam 10a1b for drawing the patterns P1c, P1f, P1g, P1h, P1i which are respectively smaller than the largest pattern P (see FIG. 3B). Actually, in the charged particle beam drawing apparatus 10 of the first embodiment, shot division is performed, so that drawing of a small pattern, such as the pattern (see FIG. 7I), is avoided. Namely, if the pattern P1 (see FIG. 7I) is drawn by nine times shots of the charged particle beam 10a1b (see FIG. 3A), the pattern P1 is equally divided into nine patterns, the nine patterns are arranged in three rows extending in X direction (horizontal direction in FIG. 7I) of three, and each pattern is drawn by one shot of the charged particle beam 10a1b (see FIG. 3A).

In the charged particle beam drawing apparatus 10 of the first embodiment, as shown in FIGS. 7A, 7B, 7C, 7D, 7E, 7F, 7G, 7H and 7I, when the pattern P1 corresponding to the figure FG1 (see FIG. 4) included in the drawing data D (see FIGS. 1 and 2) is drawn in the stripe frame STR3 (see FIGS. 5 and 6) on the workpiece M by the charged particle beam 10a1b (see FIG. 3A), the movable stage 10a2a (see FIG. 1) is controlled via the stage control circuit 10b6 (see FIG. 1) by the stage control portion 10b1i (see FIG. 2), so that the movable stage 10a2a is moved from minus side (left side of FIG. 5) of X axis to plus side (right side of FIG. 5) of X axis.

Figure 8A:
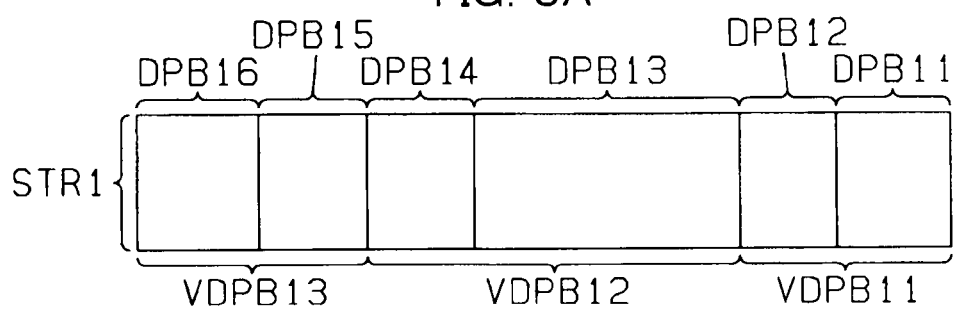
FIGS. 8A and 8B show an example of a stripe frame STR1 shown in FIG. 5, in detail.
Figure 8B:
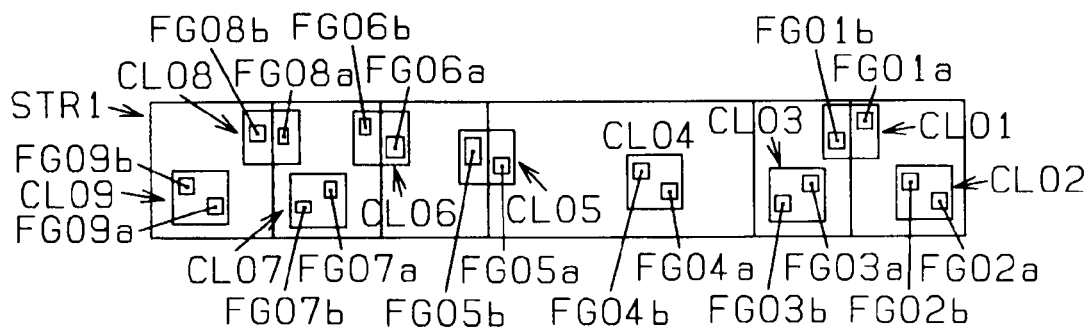

FIGS. 8A and 8B show an example of the stripe frame STR1 shown in FIG. 5, in detail. FIGS. 9 to 15 explain a convert process of the drawing data D in the charged particle beam drawing apparatus 10 of the first embodiment. FIGS. 16A, 16B, 16C, 17A, 17B, 17C, 17D, 17E and 17F explain a data formed in a convert process of the drawing data D in the charged particle beam drawing apparatus 10 of the first embodiment.

In the charged particle beam drawing apparatus 10 of the first embodiment, each of the stripe frames STR1, STR2, STR3, STR4, SIRS, STR6 (see FIG. 5) is virtually divided into block frames in order that convert process of data is performed in parallel in the converter module 10b1e (see FIG. 2), the shot data forming portion 10b1h (see FIG. 2) etc. of the control computer 10b1 (see FIGS. 1 and 2) of the control portion 10b (see FIG. 1).

In the example shown in FIGS. 8A and 8B, the stripe frame STR1 (see FIG. 8A) is virtually divided into six block frames DPB11, DPB12, DPB13, DPB14, DPB15, DPB16 (see FIG. 8A).

In the charged particle beam drawing apparatus 10 of the first embodiment, in order to decrease the capacity of the output buffer and the memory, and transfer time of data, adjacent block frames, such as two block frames, of block frames DPB11, DPB12, DPB13, DPB14, DPB15, DPB16 (see FIG. 8A) in stripe frames STR1, STR2, STR3, STR4, STR5, STR6 (see FIG. 5) combine into virtual block frames VDPB11, VDPB12, VDPB13 (see FIG. 8A).

In the example shown in FIGS. 8A and 8B, two adjacent block frames DPB11, DPB12 (see FIG. 8A) combine into the virtual block frame VDPB11 (see FIG. 8A). Two adjacent block frames DPB13, DPB14 (see FIG. 8A) combine into the virtual block frame VDPB12 (see FIG. 8A). Two adjacent block frames DPB15, DPB16 (see FIG. 8A) combine into the virtual block frame VDPB13 (see FIG. 8A).

In the example shown in FIGS. 8A and 8B, a cell CL01 (see FIG. 8B) extends over the block frame DPB11 (see FIG. 8A) and the block frame DPB12 (see FIG. 8A). The cell CL01 includes plural figures, such as two figures FG01a, FG01b (see FIG. 8B). A cell CL02 (see FIG. 8B) is included in the block frame DPB11 (see FIG. 8A). The cell CL02 includes plural figures, such as two figures FG02a, FG02b (see FIG. 8B). A cell CL03 (see FIG. 8B) is included in the block frame DPB12 (see FIG. 8A). The cell CL03 includes plural figures, such as two figures FG03a, FG03b (see FIG. 8B).

In the example shown in FIGS. 8A and 8B, a cell CL04 (see FIG. 8B) is included in the block frame DPB13 (see FIG. 8A). The cell CL04 includes plural figures, such as two figures FG04a, FG04b (see FIG. 8B). A cell CL05 (see FIG. 8B) extends over the block frame DPB13 (see FIG. 8A) and the block frame DPB14 (see FIG. 8A). The cell CL05 includes plural figures, such as two figures FG05a, FG05b (see FIG. 8B). A cell CL06 (see FIG. 8B) extends over the block frame DPB14 (see FIG. 8A) and the block frame DPB15 (see FIG. 8A). The cell CL06 includes plural figures, such as two figures FG06a, FG06b (see FIG. 8B).

In the example shown in FIGS. 8A and 8B, a cell CL07 (see FIG. 8B) is included in the block frame DPB15 (see FIG. 8A). The cell CL07 includes plural figures, such as two figures FG07a, FG07b (see FIG. 8B). A cell CL08 (see FIG. 8B) extends over the block frame DPB15 (see FIG. 8A) and the block frame DPB16 (see FIG. 8A). The cell CL08 includes plural figures, such as two figures FG08a, FG08b (see FIG. 8B). A cell CL09 (see FIG. 8B) is included in the block frame DPB16 (see FIG. 8A). The cell CL09 includes plural figures, such as two figures FG09a, FG09b (see FIG. 8B).

In detail, in the example shown in FIGS. 8A and 8B, the stripe frame STR1 (see FIG. 8A) is divided into six block frames DPB11, DPB12, DPB13, DPB14, DPB15, DPB16 (see FIG. 8A), so that the number of shots of the charged particle beam 10a1b (see FIG. 3A) for drawing patterns corresponding to the figures FG01a, FG02a, FG02b (see FIG. 8B) included in the block frame DPB11 (see FIG. 8A), the number of shots of the charged particle beam 10a1b (see FIG. 3A) for drawing patterns corresponding to the figures FG01b, FG03a, FG03b (see FIG. 8B) included in the block frame DPB12 (see FIG. 8A), the number of shots of the charged particle beam 10a1b (see FIG. 3A) for drawing patterns corresponding to the figures FG04a, FG04b, FG05a (see FIG. 8B) included in the block frame DPB13 (see FIG. 8A), the number of shots of the charged particle beam 10a1b (see FIG. 3A) for drawing patterns corresponding to the figures FG05b, FG06a (see FIG. 8B) included in the block frame DPB14 (see FIG. 8A), the number of shots of the charged particle beam 10a1b (see FIG. 3A) for drawing patterns corresponding to the figures FG06b, FG07a, FG07b, FG08a (see FIG. 8B) included in the block frame DPB15 (see FIG. 8A), and the number of shots of the charged particle beam 10a1b (see FIG. 3A) for drawing patterns corresponding to the figures FG08b, FG09a, FG09b (see FIG. 8B) included in the block frame DPB16 (see FIG. 8A) are approximately equal.

For example, in the charged particle beam drawing apparatus 10 of the first embodiment, if the drawing data D (see FIGS. 1 and 2) includes cells CL01, CL02, CL03, CL04, CL05, CL06, CL07, CL08, CL09 (see FIG. 8B) and figures FG01a, FG01b, FG02a, FG02b, FG03a, FG03b, FG04a, FG04b, FG05a, FG05b, FG06a, FG06b, FG07a, FG07b, FG08a, FG08b, FG09a, FG09b (see FIG. 8B), as shown in FIG. 9, the drawing data D corresponding to all of a drawing area DA (see FIG. 5) on a workpiece M (see FIG. 5) is read by the reading module 10b1a and stored to the input buffer 10b1b.

Figure 10:
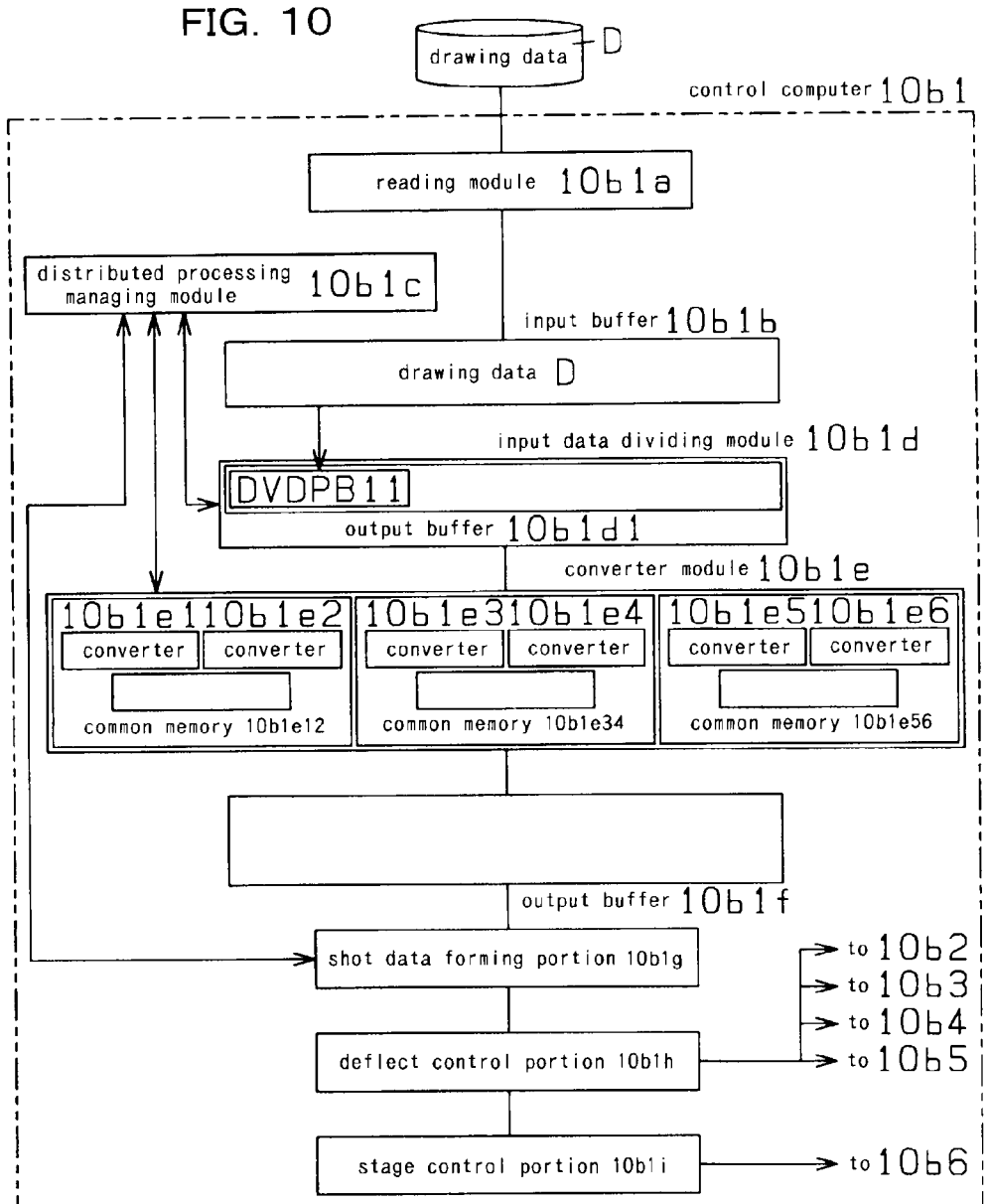

Then, in the charged particle beam drawing apparatus 10 of the first embodiment, as shown in FIG. 10, a data DVDPB11 corresponding to the virtual block frame VDPB11 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d, on the basis of a localizing requirement of the distributed processing managing module 10b1c.

Figure 16A:
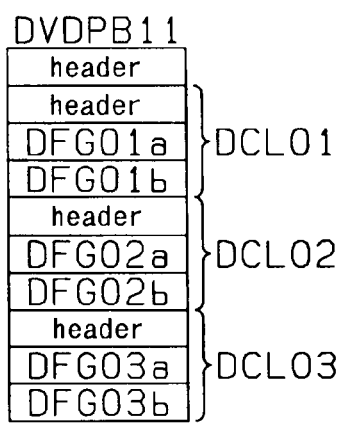
FIGS. 16A, 16B, 16C, 17A, 17B, 17C, 17D, 17E and 17F explain a data formed in a convert process of the drawing data D in the charged particle beam drawing apparatus 10 of the first embodiment.

As shown in FIG. 16A, in the data DVDPB11 corresponding to the virtual block frame VDPB11 (see FIG. 8A), a header of the data DVDPB11, a data DCL01 corresponding to the cell CL01 (see FIG. 8B) included in the virtual block frame VDPB11 (see FIG. 8A), a data DCL02 corresponding to the cell CL02 (see FIG. 8B) included in the virtual block frame VDPB11 (see FIG. 8A), and a data DCL03 corresponding to the cell CL03 (see FIG. 8B) included in the virtual block frame VDPB11 (see FIG. 8A) are included. In the data DCL01 corresponding to the cell CL01 (see FIG. 8B), a header of the data DCL01, a data DFG01a corresponding to the figure FG01a (see FIG. 8B) included in the cell CL01 (see FIG. 8B), and a data DFG01b corresponding to the figure FG01b (see FIG. 8B) included in the cell CL01 (see FIG. 8B) are included. In the data DCL02 corresponding to the cell CL02 (see FIG. 8B), a header of the data DCL02, a data DFG02a corresponding to the figure FG02a (see FIG. 8B) included in the cell CL02 (see FIG. 8B), and a data DFG02b corresponding to the figure FG02b (see FIG. 8B) included in the cell CL02 (see FIG. 8B) are included. In the data DCL03 corresponding to the cell CL03 (see FIG. 8B), a header of the data DCL03, a data DFG03a corresponding to the figure FG03a (see FIG. 8B) included in the cell CL03 (see FIG. 8B), and a data DFG03b corresponding to the figure FG03b (see FIG. 8B) included in the cell CL03 (see FIG. 8B) are included.

Figure 11:
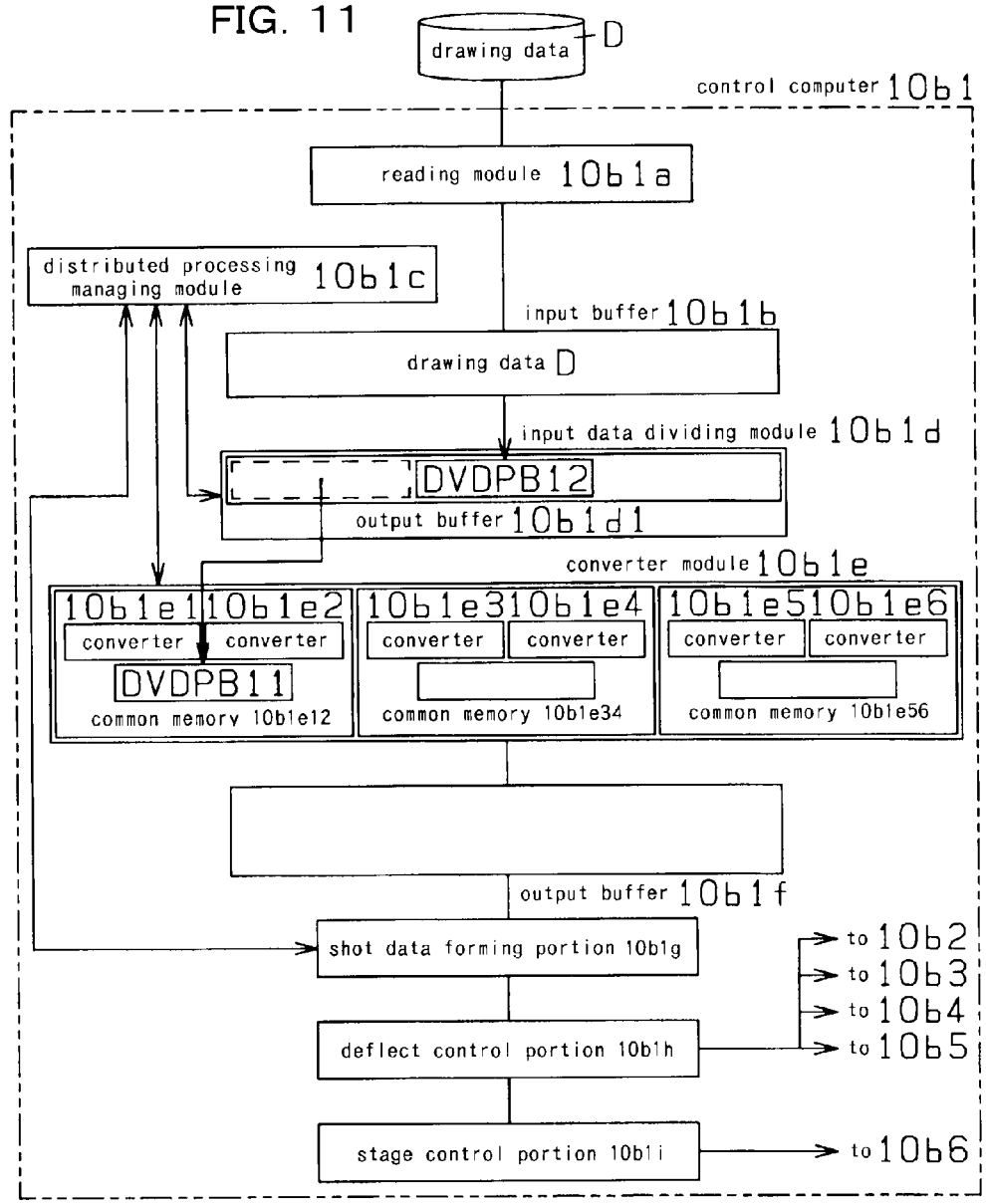

Then, in the charged particle beam drawing apparatus 10 of the first embodiment, as shown in FIG. 11, a data DVDPB12 corresponding to the virtual block frame VDPB12 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d. Also, the data DVDPB11 corresponding to the virtual block frame VDPB11 (see FIG. 8A) is transferred from the output buffer 10b1d1 to the common memory 10b1e12 of a converter 10b1e1 corresponding to the block frame DPB11 (see FIG. 8A) and a converter 10b1e2 corresponding to the block frame DPB12 (see FIG. 8A) of the converter module 10b1e, on the basis of a requirement of the distributed processing managing module 10b1c.

Figure 16B:
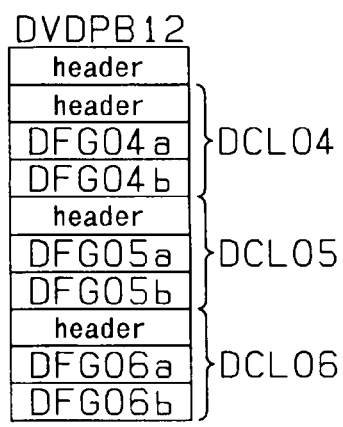

As shown in FIG. 16B, in the data DVDPB12 corresponding to the virtual block frame VDPB12 (see FIG. 8A), a header of the data DVDPB12, a data DCL04 corresponding to the cell CL04 (see FIG. 8B) included in the virtual block frame VDPB12 (see FIG. 8A), a data DCL05 corresponding to the cell CL05 (see FIG. 8B) included in the virtual block frame VDPB12 (see FIG. 8A), and a data DCL06 corresponding to the cell CL06 (see FIG. 8B), at least a part of the cell CL06 (see FIG. 8B) being included in the virtual block frame VDPB12 (see FIG. 8A), are included. In the data DCL04 corresponding to the cell CL04 (see FIG. 8B), a header of the data DCL04, a data DFG04a corresponding to the figure FG04a (see FIG. 8B) included in the cell CL04 (see FIG. 8B), and a data DFG04b corresponding to the figure FG04b (see FIG. 8B) included in the cell CL04 (see FIG. 8B) are included. In the data DCL05 corresponding to the cell CL05 (see FIG. 8B), a header of the data DCL05, a data DFG05a corresponding to the figure FG05a (see FIG. 8B) included in the cell CL05 (see FIG. 8B), and a data DFG05b corresponding to the figure FG05b (see FIG. 8B) included in the cell CL05 (see FIG. 8B) are included. In the data DCL06 corresponding to the cell CL06 (see FIG. 8B), a header of the data DCL06, a data DFG06a corresponding to the figure FG06a (see FIG. 8B) included in the cell CL06 (see FIG. 8B), and a data DFG06b corresponding to the figure FG06b (see FIG. 8B) included in the cell CL06 (see FIG. 8B) are included.

Then, in the charged particle beam drawing apparatus 10 of the first embodiment, as shown in FIG. 12, a data DVDPB13 corresponding to the virtual block frame VDPB13 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d. Also, the data DVDPB12 (see FIGS. 12 and 16B) corresponding to the virtual block frame VDPB12 (see FIG. 8A) is transferred from the output buffer 10b1d1 to the common memory 10b1e34 of a converter 10b1e3 corresponding to the block frame DPB13 (see FIG. 8A) and a converter 10b1e4 corresponding to the block frame DPB14 (see FIG. 8A) of the converter module 10b1e, on the basis of a requirement of the distributed processing managing module 10b1c.

Figure 16C:
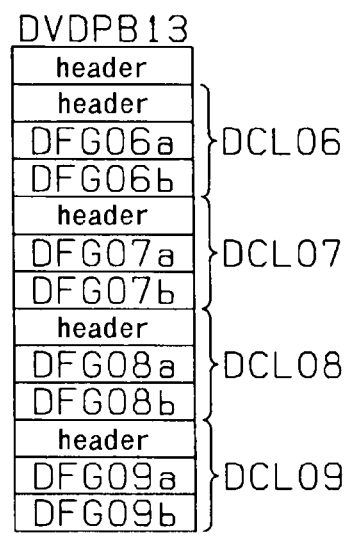
Figure 17A:
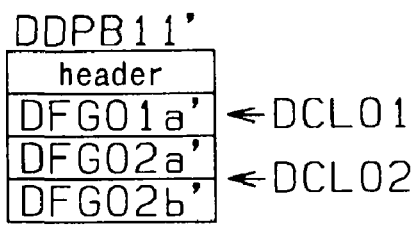
Figure 17B:
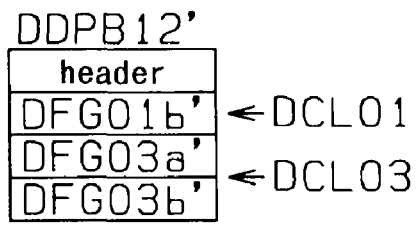
Figure 17C:
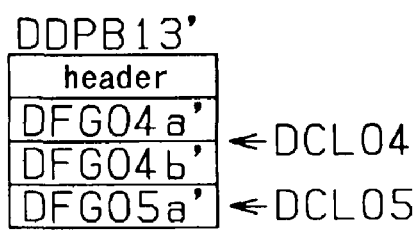
Figure 17D:
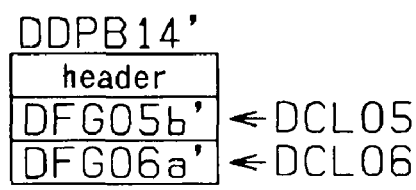
Figure 17E:
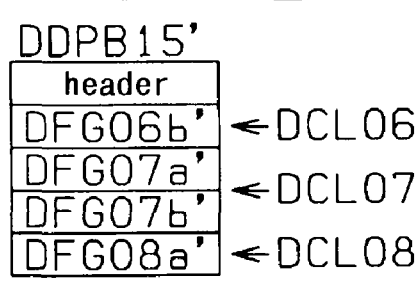
Figure 17F:
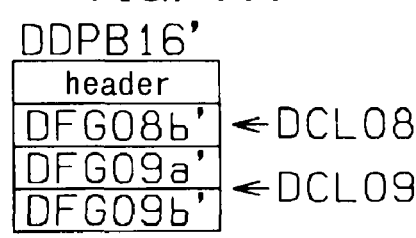

As shown in FIG. 16C, in the data DVDPB13 corresponding to the virtual block frame VDPB13 (see FIG. 8A), a header of the data DVDPB13, the data DCL06 corresponding to the cell CL06 (see FIG. 8B), at least a part of the cell CL06 (see FIG. 8B) being included in the virtual block frame VDPB13 (see FIG. 8A), a data DCL07 corresponding to the cell CL07 (see FIG. 8B) included in the virtual block frame VDPB13 (see FIG. 8A), a data DCL08 corresponding to the cell CL08 (see FIG. 8B) included in the virtual block frame VDPB13 (see FIG. 8A), and a data DCL09 corresponding to the cell CL09 (see FIG. 8B) included in the virtual block frame VDPB13 (see FIG. 8A), are included. In the data DCL06 corresponding to the cell CL06 (see FIG. 8B), the header of the data DCL06, the data DFG06a corresponding to the figure FG06a (see FIG. 8B) included in the cell CL06 (see FIG. 8B), and the data DFG06b corresponding to the figure FG06b (see FIG. 8B) included in the cell CL06 (see FIG. 8B) are included. In the data DCL07 corresponding to the cell CL07 (see FIG. 8B), a header of the data DCL07, a data DFG07a corresponding to the figure FG07a (see FIG. 8B) included in the cell CL07 (see FIG. 8B), and a data DFG07b corresponding to the figure FG07b (see FIG. 8B) included in the cell CL07 (see FIG. 8B) are included. In the data DCL08 corresponding to the cell CL08 (see FIG. 8B), a header of the data DCL08, a data DFG08a corresponding to the figure FG08a (see FIG. 8B) included in the cell CL08 (see FIG. 8B), and a data DFG08b corresponding to the figure FG08b (see FIG. 8B) included in the cell CL08 (see FIG. 8B) are included. In the data DCL09 corresponding to the cell CL09 (see FIG. 8B), a header of the data DCL09, a data DFG09a corresponding to the figure FG09a (see FIG. 8B) included in the cell CL09 (see FIG. 8B), and a data DFG09b corresponding to the figure FG09b (see FIG. 8B) included in the cell CL09 (see FIG. 8B) are included.

Then, in the charged particle beam drawing apparatus 10 of the first embodiment, as shown in FIG. 13, the data DVDPB13 (see FIGS. 13 and 16C) corresponding to the virtual block frame VDPB13 (see FIG. 8A) is transferred from the output buffer 10b1d1 to the common memory 10b1e56 of a converter 10b1e5 corresponding to the block frame DPB15 (see FIG. 8A) and a converter 10b1e6 corresponding to the block frame DPB16 (see FIG. 8A) of the converter module 10b1e, on the basis of a requirement of the distributed processing managing module 10b1c.

Then, in the charged particle beam drawing apparatus 10 of the first embodiment, as shown in FIG. 14, on the basis of a requirement of the distributed processing managing module 10b1c, the data DFG01a, DFG02a, DFG02b (see FIG. 16A) of the figures FG01a, FG02a, FG02b (see FIG. 8B) in the block frame DPB11 (see FIG. 8A), included in the data DVDPB11 (see FIG. 16A) transferred to the common memory 10b1e12 and corresponding to the virtual block frame VDPB11 (see FIG. 8A) are converted by the converter 10b1e1, so that a drawing apparatus internal format data DDPB11' (see FIGS. 14 and 17A) corresponding to the block frame DPB11 (see FIG. 8A) and including drawing apparatus internal format data DFG01a', DFG02a', DFG02b' (see FIG. 17A) of the figures FG01a, FG02a, FG02b, is formed and stored to an output buffer 10b1f.

In the charged particle beam drawing apparatus 10 of the first embodiment, as shown in FIG. 14, in parallel with the convert process of the converter 10b1e1, the data DFG04a, DFG04b, DFG05a (see FIG. 16B) of the figures FG04a, FG04b, FG05a (see FIG. 8B) in the block frame DPB13 (see FIG. 8A), included in the data DVDPB12 (see FIG. 16B) transferred to the common memory 10b1e34 and corresponding to the virtual block frame VDPB12 (see FIG. 8A) are converted by the converter 10b1e3, so that a drawing apparatus internal format data DDPB13' (see FIGS. 14 and 17C) corresponding to the block frame DPB13 (see FIG. 8A) and including drawing apparatus internal format data DFG04a', DFG04b', DFG05a' (see FIG. 17C) of the figures FG04a, FG04b, FG05a, is formed and stored to the output buffer 10b1f.

In the charged particle beam drawing apparatus 10 of the first embodiment, as shown in FIG. 14, in parallel with the convert process of the converters 10b1e1, 10b1e3, the data DFG06b, DFG07a, DFG07b, DFG08a (see FIG. 16C) of the figures FG06b, FG07a, FG07b, FG08a (see FIG. 8B) in the block frame DPB15 (see FIG. 8A), included in the data DVDPB13 (see FIG. 16C) transferred to the common memory 10b1e56 and corresponding to the virtual block frame VDPB13 (see FIG. 8A) are converted by the converter 10b1e5, so that a drawing apparatus internal format data DDPB15' (see FIGS. 14 and 17E) corresponding to the block frame DPB15 (see FIG. 8A) and including drawing apparatus internal format data DFG06b', DFG07a', DFG07b', DFG08a' (see FIG. 17E) of the figures FG06b, FG07a, FG07b, FG08a, is formed and stored to the output buffer 10b1f.

In the charged particle beam drawing apparatus 10 of the first embodiment, as shown in FIG. 15, in parallel with the convert process of the converters 10b1e1, 10b1e3, 10b1e5, the data DFG01b, DFG03a, DFG03b (see FIG. 16A) of the figures FG01b, FG03a, FG03b (see FIG. 8B) in the block frame DPB12 (see FIG. 8A), included in the data DVDPB11 (see FIG. 16A) transferred to the common memory 10b1e12 and corresponding to the virtual block frame VDPB11 (see FIG. 8A) are converted by the converter 10b1e2, so that a drawing apparatus internal format data DDPB12' (see FIGS. 15 and 17B) corresponding to the block frame DPB12 (see FIG. 8A) and including drawing apparatus internal format data DFG01b', DFG03a', DFG03b' (see FIG. 17B) of the figures FG01b, FG03a, FG03b, is formed and stored to the output buffer 10b1f.

In the charged particle beam drawing apparatus 10 of the first embodiment, as shown in FIG. 15, in parallel with the convert process of the converters 10b1e1, 10b1e2, 10b1e3, 10b1e5, the data DFG05b, DFG06a (see FIG. 16B) of the figures FG05b, FG06a (see FIG. 8B) in the block frame DPB14 (see FIG. 8A), included in the data DVDPB12 (see FIG. 16B) transferred to the common memory 10b1e34 and corresponding to the virtual block frame VDPB12 (see FIG. 8A) are converted by the converter 10b1e4, so that a drawing apparatus internal format data DDPB14' (see FIGS. 15 and 17D) corresponding to the block frame DPB14 (see FIG. 8A) and including drawing apparatus internal format data DFG05b', DFG06a' (see FIG. 17D) of the figures FG05b, FG06a, is formed and stored to the output buffer 10b1f.

In the charged particle beam drawing apparatus 10 of the first embodiment, as shown in FIG. 15, in parallel with the convert process of the converters 10b1e1, 10b1e2, 10b1e3, 10b1e4, 10b1e5, the data DFG08b, DFG09a, DFG09b (see FIG. 16C) of the figures FG08b, FG09a, FG09b (see FIG. 8B) in the block frame DPB16 (see FIG. 8A), included in the data DVDPB13 (see FIG. 16C) transferred to the common memory 10b1e56 and corresponding to the virtual block frame VDPB13 (see FIG. 8A) are converted by the converter 10b1e6, so that a drawing apparatus internal format data DDPB16' (see FIGS. 15 and 17F) corresponding to the block frame DPB16 (see FIG. 8A) and including drawing apparatus internal format data DFG08b', DFG09a', DFG09b' (see FIG. 17F) of the figures FG08b, FG09a, FG09b, is formed and stored to the output buffer 10b1f.

In detail, in the example shown in FIGS. 8A and 8B, if at least one of the figures FG01a, FG01b, FG02a, FG02b, FG03a, FG03b, FG04a, FG04b, FG05a, FG05b, FG06a, FG06b, FG07a, FG07b, FG08a, FG08b, FG09a, FG09b (see FIG. 8B) is larger than the size of subfield SFn, SFn+1 (see FIG. 6), at least one figure which is larger than the size of subfield SFn, SFn+1 (see FIG. 6) is divided into plural figures, so that each divided figure is smaller than the size of subfield SFn, SFn+1 (see FIG. 6), when the convert process of the converters 10b1e1, 10b1e2, 10b1e3, 10b1e4, 10b1e5, 10b1e6 (see FIGS. 14 and 15) is performed.

A convert process of the drawing data D in a charged particle beam drawing apparatus of the related art will be explained in order to compare the convert process of the drawing data D in the charged particle beam drawing apparatus 10 of the first embodiment with the convert process of the drawing data D in the charged particle beam drawing apparatus of the related art. FIGS. 18 to 24 explain the convert process of the drawing data D in the charged particle beam drawing apparatus of the related art. FIGS. 25A, 25B, 25C, 25D, 25E, 25F explain data DDPB11, DDPB12, DDPB13, DDPB14, DDPB15, DDPB16 which are formed when the convert process of the drawing data D is performed in the charged particle beam drawing apparatus of the related art.

Figure 18:
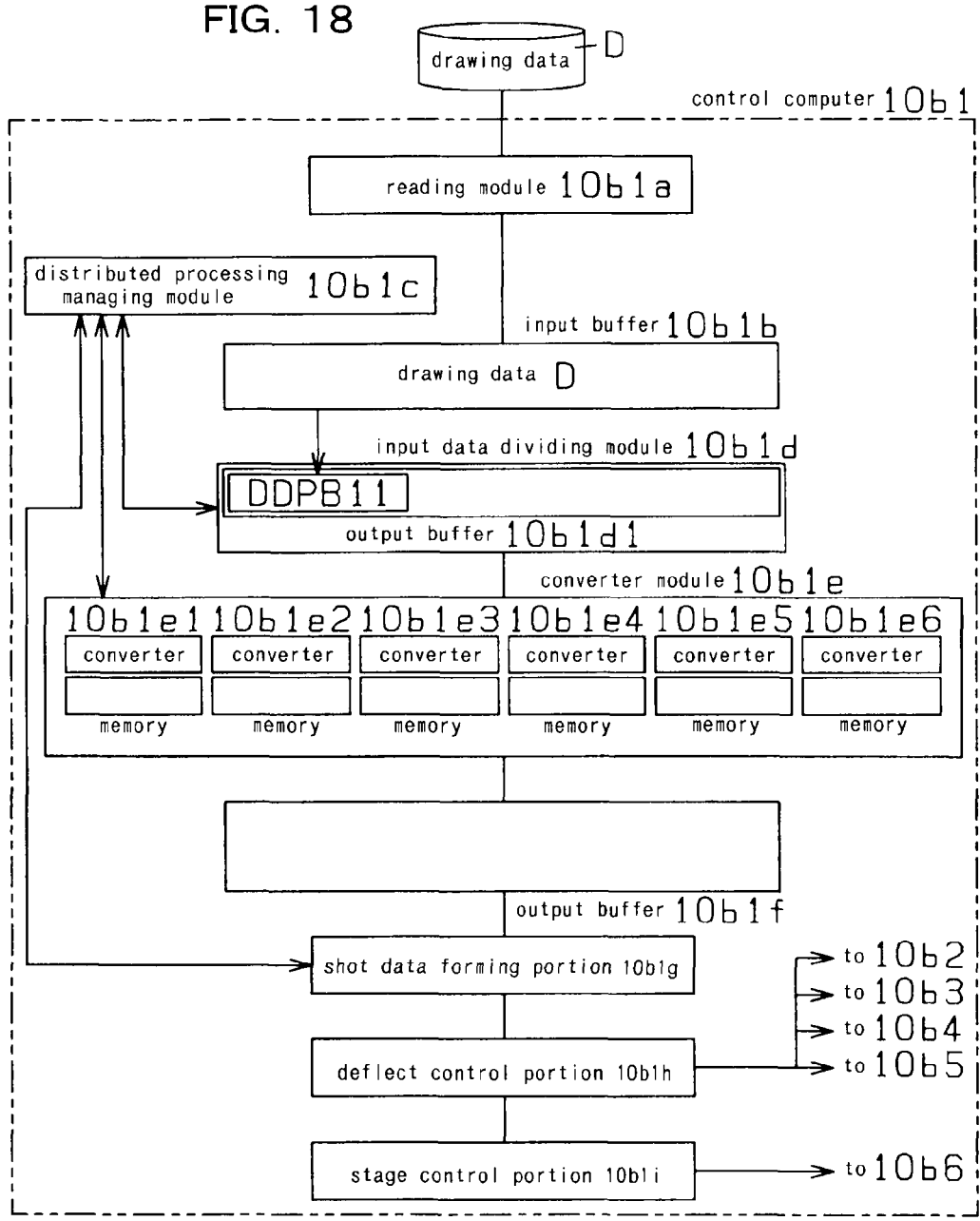
Figure 19:
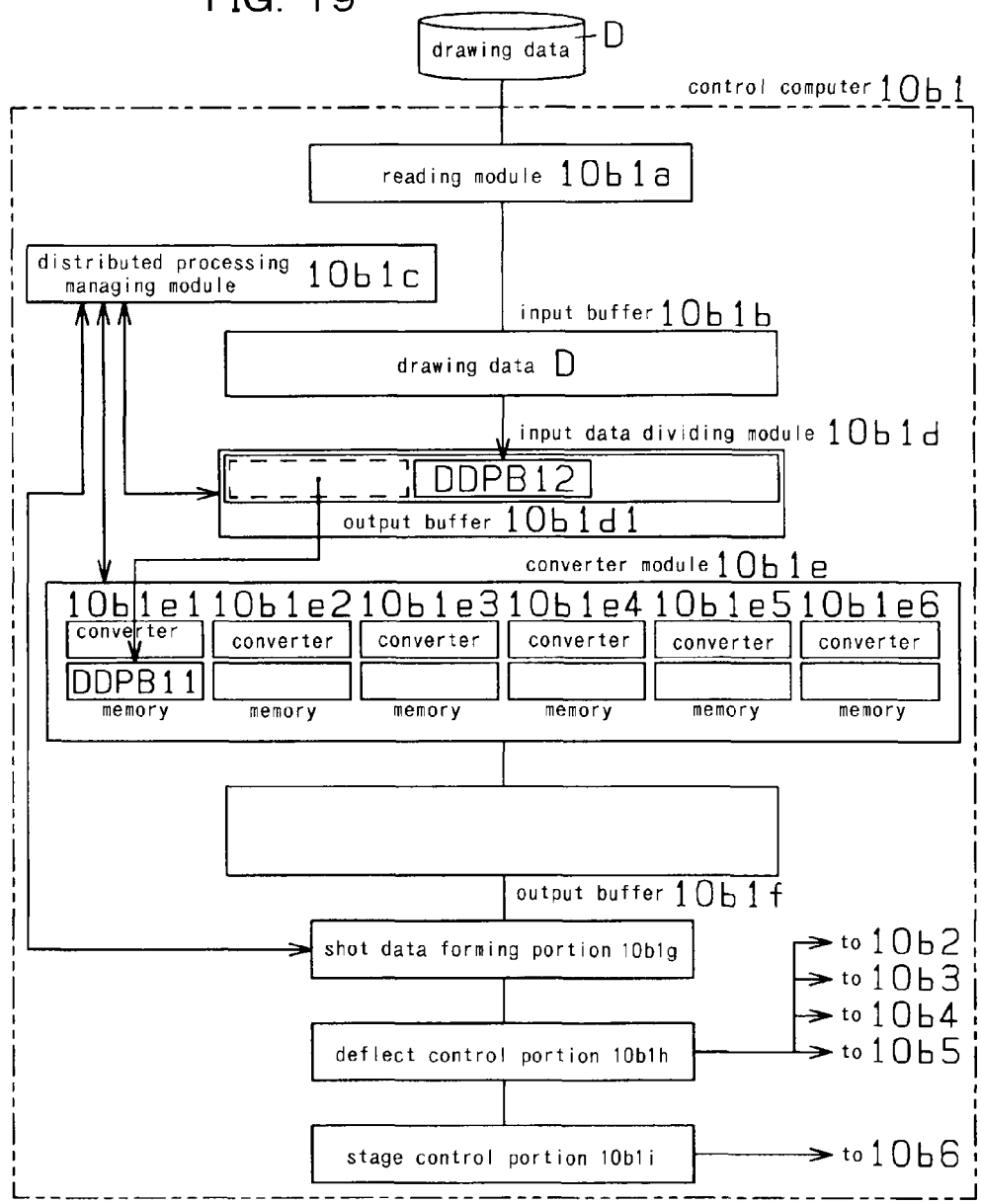

In the charged particle beam drawing apparatus 10 of the first embodiment, as shown in FIG. 10, the data DVDPB11 (see FIG. 16A) corresponding to the virtual block frame VDPB11 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d, on the basis of the localizing requirement of the distributed processing managing module 10b1c. In the charged particle beam drawing apparatus of the related art, as shown in FIG. 18, the data DDPB11 (see FIG. 25A) corresponding to the block frame DPB11 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d, on the basis of the localizing requirement of the distributed processing managing module 10b1c, and as shown in FIG. 19, the data DDPB12 (see FIG. 25B) corresponding to the block frame DPB12 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d.

Figure 25A:
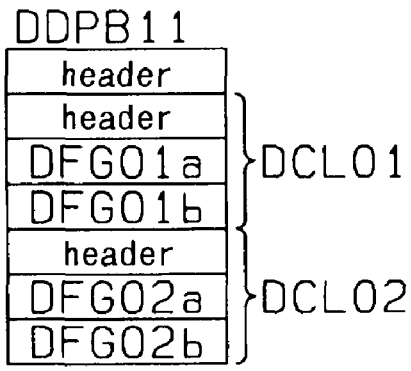
FIGS. 25A, 25B, 25C, 25D, 25E, 25F explain data DDPB11, DDPB12, DDPB13, DDPB14, DDPB15, DDPB16 which are formed when the convert process of the drawing data D is performed in the charged particle beam drawing apparatus of the related art.

As shown in FIG. 25A, in the data DDPB11 corresponding to the block frame DPB11 (see FIG. 8A), a header of the data DDPB11, the data DCL01 corresponding to the cell CL01 (see FIG. 8B), at least a part of the cell CL01 (see FIG. 8B) being included in the block frame DPB11 (see FIG. 8A), and the data DCL02 corresponding to the cell CL02 (see FIG. 8B) included in the block frame DPB11 (see FIG. 8A), are included. In the data DCL01 corresponding to the cell CL01 (see FIG. 8B), the header of the data DCL01, the data DFG01a corresponding to the figure FG01a (see FIG. 8B) included in the cell CL01 (see FIG. 8B), and the data DFG01b corresponding to the figure FG01b (see FIG. 8B) included in the cell CL01 (see FIG. 8B) are included. In the data DCL02 corresponding to the cell CL02 (see FIG. 8B), the header of the data DCL02, the data DFG02a corresponding to the figure FG02a (see FIG. 8B) included in the cell CL02 (see FIG. 8B), and the data DFG02b corresponding to the figure FG02b (see FIG. 8B) included in the cell CL02 (see FIG. 8B) are included.

Figure 25B:
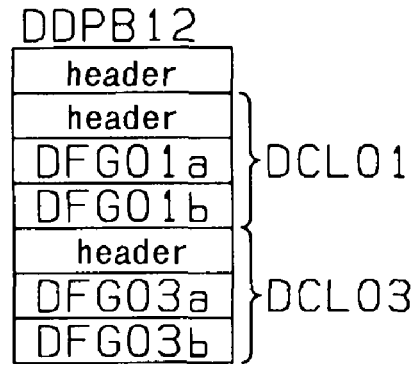

As shown in FIG. 25B, in the data DDPB12 corresponding to the block frame DPB12 (see FIG. 8A), a header of the data DDPB12, the data DCL01 corresponding to the cell CL01 (see FIG. 8B), at least a part of the cell CL01 (see FIG. 8B) being included in the block frame DPB12 (see FIG. 8A), and the data DCL03 corresponding to the cell CL03 (see FIG. 8B) included in the block frame DPB12 (see FIG. 8A), are included. In the data DCL01 corresponding to the cell CL01 (see FIG. 8B), the header of the data DCL01, the data DFG01a corresponding to the figure FG01a (see FIG. 8B) included in the cell CL01 (see FIG. 8B), and the data DFG01b corresponding to the figure FG01b (see FIG. 8B) included in the cell CL01 (see FIG. 8B) are included. In the data DCL03 corresponding to the cell CL03 (see FIG. 8B), the header of the data DCL03, the data DFG03a corresponding to the figure FG03a (see FIG. 8B) included in the cell CL03 (see FIG. 8B), and the data DFG03b corresponding to the figure FG03b (see FIG. 8B) included in the cell CL03 (see FIG. 8B) are included.

Namely, as shown in FIGS. 25A and 25B, the data DCL01 corresponding to the cell CL01 (see FIG. 8B) extending over the block frame DPB11 (see FIG. 8A) and the block frame DPB12 (see FIG. 8A) is repetitively included in the data DDPB11 corresponding to the block frame DPB11 (see FIG. 8A) and in the data DDPB12 corresponding to the block frame DPB12 (see FIG. 8A).

Figure 20:
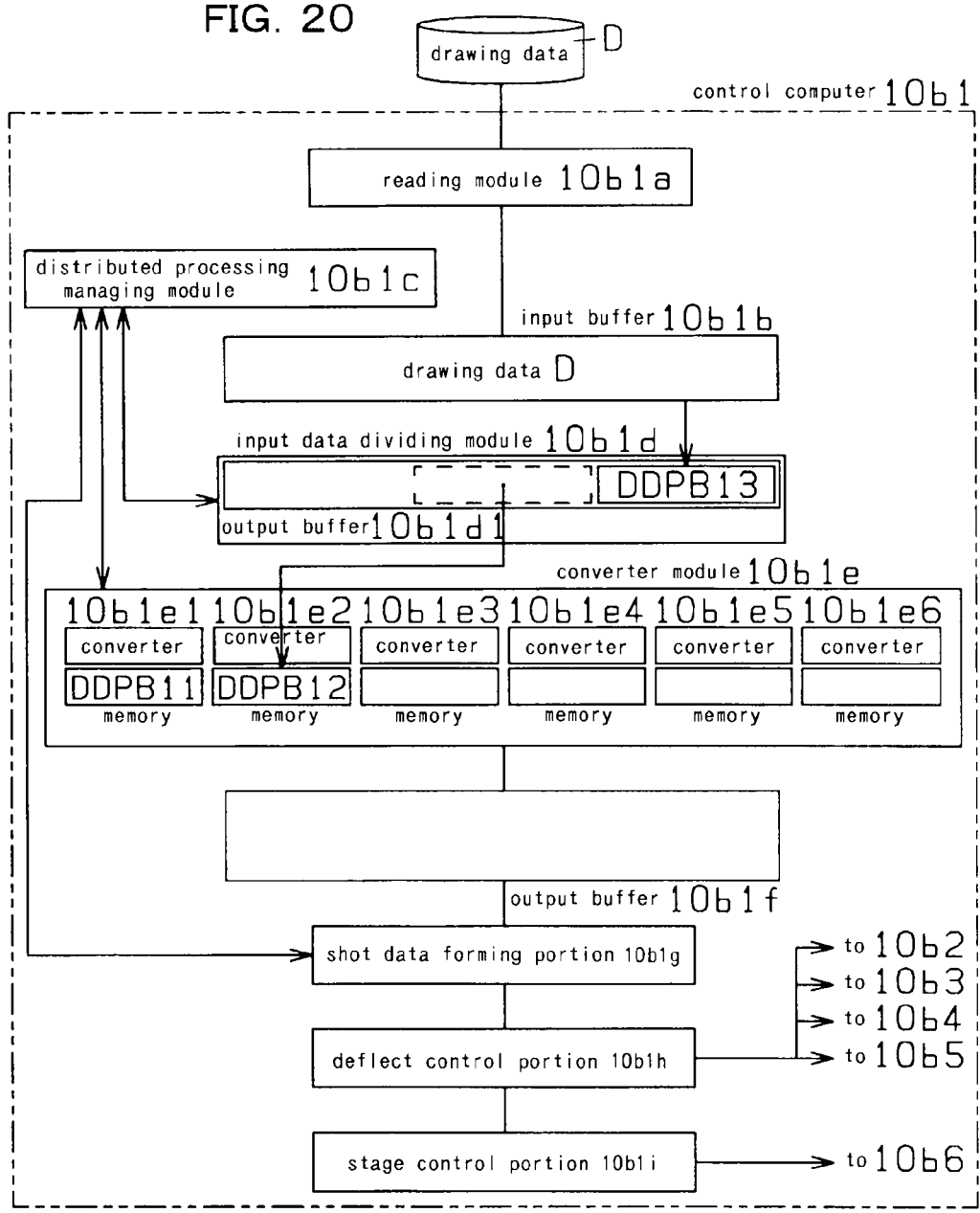

In the charged particle beam drawing apparatus 10 of the first embodiment, as shown in FIG. 11, the data DVDPB11 (see FIG. 16A) corresponding to the virtual block frame VDPB11 (see FIG. 8A) is transferred from the output buffer 10b1d1 to the common memory 10b1e12 of the converter 10b1e1 corresponding to the block frame DPB11 (see FIG. 8A) and the converter 10b1e2 corresponding to the block frame DPB12 (see FIG. 8A) of the converter module 10b1e, on the basis of the requirement of the distributed processing managing module 10b1c. In the charged particle beam drawing apparatus of the related art, as shown in FIG. 19, the data DDPB11 (see FIG. 25A) corresponding to the block frame DPB11 (see FIG. 8A) is transferred from the output buffer 10b1d1 to a memory of the converter 10b1e1 on the basis of a requirement of the distributed processing managing module 10b1c, and as shown in FIG. 20, the data DDPB12 (see FIG. 25B) corresponding to the block frame DPB12 (see FIG. 8A) is transferred from the output buffer 10b1d1 to a memory of the converter 10b1e2 on the basis of a requirement of the distributed processing managing module 10b1c.

Figure 21:
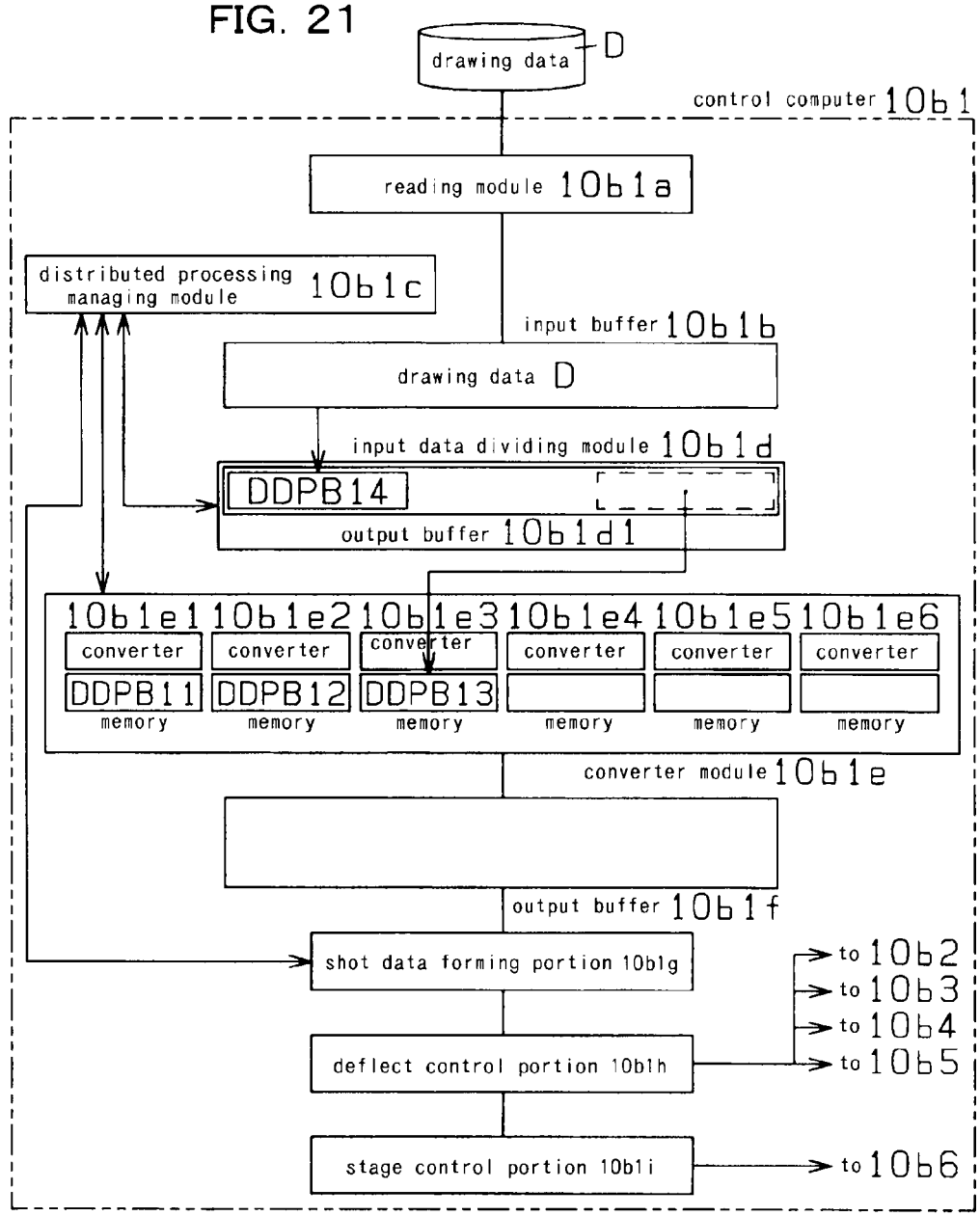

In the charged particle beam drawing apparatus 10 of the first embodiment, as shown in FIG. 11, the data DVDPB12 (see FIG. 16B) corresponding to the virtual block frame VDPB12 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d, on the basis of the localizing requirement of the distributed processing managing module 10b1c. In the charged particle beam drawing apparatus of the related art, as shown in FIG. 20, the data DDPB13 (see FIG. 25C) corresponding to the block frame DPB13 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d, on the basis of the localizing requirement of the distributed processing managing module 10b1c, and as shown in FIG. 21, the data DDPB14 (see FIG. 25D) corresponding to the block frame DPB14 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, by the input data dividing module 10b1d.

Figure 25C:
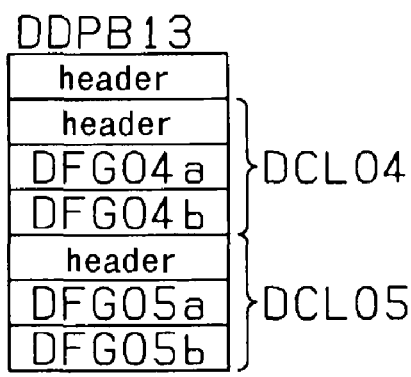

As shown in FIG. 25C, in the data DDPB13 corresponding to the block frame DPB13 (see FIG. 8A), a header of the data DDPB13, the data DCL04 corresponding to the cell CL04 (see FIG. 8B) included in the block frame DPB13 (see FIG. 8A), and the data DCL05 corresponding to the cell CL05 (see FIG. 8B), at least a part of the cell CL05 (see FIG. 8B) being included in the block frame DPB13 (see FIG. 8A), are included. In the data DCL04 corresponding to the cell CL04 (see FIG. 8B), the header of the data DCL04, the data DFG04a corresponding to the figure FG04a (see FIG. 8B) included in the cell CL04 (see FIG. 8B), and the data DFG04b corresponding to the figure FG04b (see FIG. 8B) included in the cell CL04 (see FIG. 8B) are included. In the data DCL05 corresponding to the cell CL05 (see FIG. 8B), the header of the data DCL05, the data DFG05a corresponding to the figure FG05a (see FIG. 8B) included in the cell CL05 (see FIG. 8B), and the data DFG05*b* corresponding to the figure FG05*b* (see FIG. 8B) included in the cell CL05 (see FIG. 8B) are included.

Figure 25D:
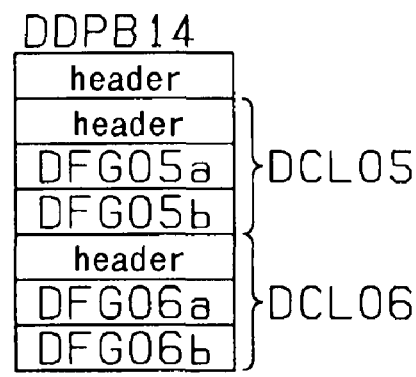

As shown in FIG. 25D, in the data DDPB14 corresponding to the block frame DPB14 (see FIG. 8A), a header of the data DDPB14, the data DCL05 corresponding to the cell CL05 (see FIG. 8B), at least a part of the cell CL05 (see FIG. 8B) being included in the block frame DPB14 (see FIG. 8A), and the data DCL06 corresponding to the cell CL06 (see FIG. 8B), at least a part of the cell CL06 (see FIG. 8B) being included in the block frame DPB14 (see FIG. 8A), are included. In the data DCL05 corresponding to the cell CL05 (see FIG. 8B), the header of the data DCL05, the data DFG05*a* corresponding to the figure FG05*a* (see FIG. 8B) included in the cell CL05 (see FIG. 8B), and the data DFG05*b* corresponding to the figure FG05*b* (see FIG. 8B) included in the cell CL05 (see FIG. 8B) are included. In the data DCL06 corresponding to the cell CL06 (see FIG. 8B), the header of the data DCL06, the data DFG06*a* corresponding to the figure FG06*a* (see FIG. 8B) included in the cell CL06 (see FIG. 8B), and the data DFG06*b* corresponding to the figure FG06*b* (see FIG. 8B) included in the cell CL06 (see FIG. 8B) are included.

Namely, as shown in FIGS. 25C and 25D, the data DCL05 corresponding to the cell CL05 (see FIG. 8B) extending over the block frame DPB13 (see FIG. 8A) and the block frame DPB14 (see FIG. 8A) is repetitively included in the data DDPB13 corresponding to the block frame DPB13 (see FIG. 8A) and in the data DDPB14 corresponding to the block frame DPB14 (see FIG. 8A).

In the charged particle beam drawing apparatus 10 of the first embodiment, as shown in FIG. 12, the data DVDPB12 (see FIG. 16B) corresponding to the virtual block frame VDPB12 (see FIG. 8A) is transferred from the output buffer 10*b*1*d*1 to the common memory 10*b*1*e*34 of the converter 10*b*1*e*3 corresponding to the block frame DPB13 (see FIG. 8A) and the converter 10*b*1*e*4 corresponding to the block frame DPB14 (see FIG. 8A) of the converter module 10*b*1*e*, on the basis of the requirement of the distributed processing managing module 10*b*1*c*. In the charged particle beam drawing apparatus of the related art, as shown in FIG. 21, the data DDPB13 (see FIG. 25C) corresponding to the block frame DPB13 (see FIG. 8A) is transferred from the output buffer 10*b*1*d*1 to a memory of the converter 10*b*1*e*3 on the basis of a requirement of the distributed processing managing module 10*b*1*c*, and as shown in FIG. 22, the data DDPB14 (see FIG. 25D) corresponding to the block frame DPB14 (see FIG. 8A) is transferred from the output buffer 10*b*1*d*1 to a memory of the converter 10*b*1*e*4 on the basis of a requirement of the distributed processing managing module 10*b*1*c*.

In the charged particle beam drawing apparatus 10 of the first embodiment, as shown in FIG. 12, the data DVDPB13 (see FIG. 16C) corresponding to the virtual block frame VDPB13 (see FIG. 8A) which is a part of the drawing data D (see FIGS. 1 and 2) corresponding to all of the drawing area DA (see FIG. 5) on the workpiece M (see FIG. 5), is read from the input buffer 10*b*1*b*, and is stored to the output buffer 10*b*1*d*1, by the input data dividing module 10*b*1*d*, on the basis of the localizing requirement of the distributed processing managing module 10*b*1*c*. In the charged particle beam drawing apparatus of the related art, as shown in FIG. 22, the data DDPB15 (see FIG. 25E) corresponding to the block frame DPB15 (see FIG. 8A) which is a part of the drawing data D (see FIGS. 1 and 2) corresponding to all of the drawing area DA (see FIG. 5) on the workpiece M (see FIG. 5), is read from the input buffer 10*b*1*b*, and is stored to the output buffer 10*b*1*d*1, by the input data dividing module 10*b*1*d*, on the basis of the localizing requirement of the distributed processing managing module 10*b*1*c*, and as shown in FIG. 23, the data DDPB16 (see FIG. 25F) corresponding to the block frame DPB16 (see FIG. 8A) which is a part of the drawing data D (see FIGS. 1 and 2) corresponding to all of the drawing area DA (see FIG. 5) on the workpiece M (see FIG. 5), is read from the input buffer 10*b*1*b*, and is stored to the output buffer 10*b*1*d*1, by the input data dividing module 10*b*1*d*.

Figure 25E:
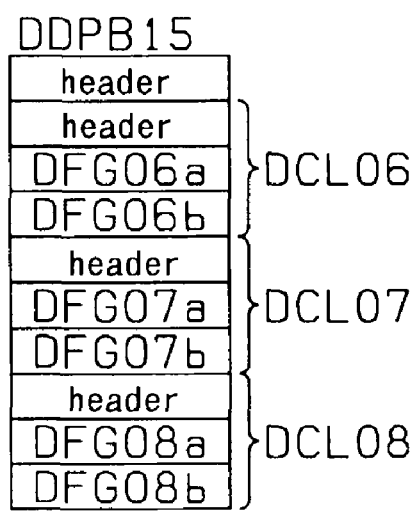

As shown in FIG. 25E, in the data DDPB15 corresponding to the block frame DPB15 (see FIG. 8A), a header of the data DDPB15, the data DCL06 corresponding to the cell CL06 (see FIG. 8B), at least a part of the cell CL06 (see FIG. 8B) being included in the block frame DPB15 (see FIG. 8A), the data DCL07 corresponding to the cell CL07 (see FIG. 8B) included in the block frame DPB15 (see FIG. 8A), and the data DCL08 corresponding to the cell CL08 (see FIG. 8B), at least a part of the cell CL08 (see FIG. 8B) being included in the block frame DPB15 (see FIG. 8A), are included. In the data DCL06 corresponding to the cell CL06 (see FIG. 8B), the header of the data DCL06, the data DFG06*a* corresponding to the figure FG06*a* (see FIG. 8B) included in the cell CL06 (see FIG. 8B), and the data DFG06*b* corresponding to the figure FG06*b* (see FIG. 8B) included in the cell CL06 (see FIG. 8B) are included. In the data DCL07 corresponding to the cell CL07 (see FIG. 8B), the header of the data DCL07, the data DFG07*a* corresponding to the figure FG07*a* (see FIG. 8B) included in the cell CL07 (see FIG. 8B), and the data DFG07*b* corresponding to the figure FG07*b* (see FIG. 8B) included in the cell CL07 (see FIG. 8B) are included. In the data DCL08 corresponding to the cell CL08 (see FIG. 8B), the header of the data DCL08, the data DFG08*a* corresponding to the figure FG08*a* (see FIG. 8B) included in the cell CL08 (see FIG. 8B), and the data DFG08*b* corresponding to the figure FG08*b* (see FIG. 8B) included in the cell CL08 (see FIG. 8B) are included.

Figure 25F:
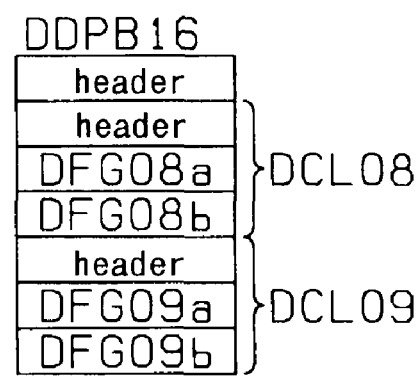

As shown in FIG. 25F, in the data DDPB16 corresponding to the block frame DPB16 (see FIG. 8A), a header of the data DDPB16, the data DCL08 corresponding to the cell CL08 (see FIG. 8B), at least a part of the cell CL08 (see FIG. 8B) being included in the block frame DPB16 (see FIG. 8A), and the data DCL09 corresponding to the cell CL09 (see FIG. 8B) included in the block frame DPB16 (see FIG. 8A), are included. In the data DCL08 corresponding to the cell CL08 (see FIG. 8B), the header of the data DCL08, the data DFG08*a* corresponding to the figure FG08*a* (see FIG. 8B) included in the cell CL08 (see FIG. 8B), and the data DFG08*b* corresponding to the figure FG08*b* (see FIG. 8B) included in the cell CL08 (see FIG. 8B) are included. In the data DCL09 corresponding to the cell CL09 (see FIG. 8B), the header of the data DCL09, the data DFG09*a* corresponding to the figure FG09*a* (see FIG. 8B) included in the cell CL09 (see FIG. 8B), and the data DFG09*b* corresponding to the figure FG09*b* (see FIG. 8B) included in the cell CL09 (see FIG. 8B) are included.

Namely, as shown in FIGS. 25E and 25F, the data DCL08 corresponding to the cell CL08 (see FIG. 8B) extending over the block frame DPB15 (see FIG. 8A) and the block frame DPB16 (see FIG. 8A) is repetitively included in the data DDPB15 corresponding to the block frame DPB15 (see FIG. 8A) and in the data DDPB16 corresponding to the block frame DPB16 (see FIG. 8A).

In the charged particle beam drawing apparatus 10 of the first embodiment, as shown in FIG. 13, the data DVDPB13 (see FIG. 16C) corresponding to the virtual block frame VDPB13 (see FIG. 8A) is transferred from the output buffer 10*b*1*d*1 to the common memory 10*b*1*e*56 of the converter 10*b*1*e*5 corresponding to the block frame DPB15 (see FIG.

8A) and the converter 10b1e6 corresponding to the block frame DPB16 (see FIG. 8A) of the converter module 10b1e, on the basis of the requirement of the distributed processing managing module 10b1c. In the charged particle beam drawing apparatus of the related art, as shown in FIG. 23, the data DDPB15 (see FIG. 25E) corresponding to the block frame DPB15 (see FIG. 8A) is transferred from the output buffer 10b1d1 to a memory of the converter 10b1e5 on the basis of a requirement of the distributed processing managing module 10b1c, and as shown in FIG. 24, the data DDPB16 (see FIG. 25F) corresponding to the block frame DPB16 (see FIG. 8A) is transferred from the output buffer 10b1d1 to a memory of the converter 10b1e6 on the basis of a requirement of the distributed processing managing module 10b1c.

In other words, in the charged particle beam drawing apparatus of the related art, as shown in FIG. 18, the data DDPB11 (see FIG. 25A) corresponding to the block frame DPB11 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1, and as shown in FIG. 19, the data DDPB12 (see FIG. 25B) corresponding to the block frame DPB12 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1.

Namely, in the charged particle beam drawing apparatus of the related art, the data DCL01 (see FIG. 25A) which is a part of the data DDPB11 (see FIG. 25A) corresponding to the block frame DPB11 (see FIG. 8A), the data DCL01 (see FIG. 25A) corresponding to the cell CL01 (see FIG. 8B) extending over the block frame DPB11 (see FIG. 8A) and the block frame DPB12 (see FIG. 8A), is stored to the output buffer 10b1d1 (see FIG. 18) of the input data dividing module 10b1d (see FIG. 18), and the data DCL01 (see FIG. 25A) which is also a part of the data DDPB12 (see FIG. 25B) corresponding to the block frame DPB12 (see FIG. 8A), the data DCL01 (see FIG. 25A) corresponding to the cell CL01 (see FIG. 8B) extending over the block frame DPB11 (see FIG. 8A) and the block frame DPB12 (see FIG. 8A), is stored to the output buffer 10b1d1 (see FIG. 19) of the input data dividing module 10b1d (see FIG. 19).

That is to say, in the charged particle beam drawing apparatus of the related art, the data DCL01 (see FIGS. 25A and 25B) corresponding to the cell CL01 (see FIG. 8B) extending over the block frame DPB11 (see FIG. 8A) and the block frame DPB12 (see FIG. 8A) is repetitively stored to the output buffer 10b1d1 (see FIGS. 18 and 19) of the input data dividing module 10b1d (see FIGS. 18 and 19), as a part of the data DDPB11 (see FIG. 25A) and as a part of the data DDPB12 (see FIG. 25B).

On the other hand, in the charged particle beam drawing apparatus 10 of the first embodiment, the block frames DPB11, DPB12 (see FIG. 8A) combine into the virtual block frame VDPB11 (see FIG. 8A), and as shown in FIG. 10, the data DVDPB11 (see FIG. 16A) corresponding to the virtual block frame VDPB11 (see FIG. 8A) which is a part of the drawing data D (see FIGS. 1 and 2) corresponding to all of the drawing area DA (see FIG. 5) on the workpiece M (see FIG. 5), is read from the input buffer 10b1b, and is stored to the output buffer 10b1d1 of the input data dividing module 10b1d.

Namely, in the charged particle beam drawing apparatus 10 of the first embodiment, the data DCL01 (see FIG. 16A) corresponding to the cell CL01 (see FIG. 8B) extending over the block frame DPB11 (see FIG. 8A) and the block frame DPB12 (see FIG. 8A), the data DCL01 (see FIG. 16A) being a part of the data DVDPB11 (see FIG. 16A) corresponding to the virtual block frame VDPB11 (see FIG. 8A), is not repetitively stored to the output buffer 10b1d1 (see FIG. 10) of the input data dividing module 10b1d (see FIG. 10).

Consequently, in the charged particle beam drawing apparatus 10 of the first embodiment, the capacity of the output buffer 10b1d1 (see FIG. 10) of the input data dividing module 10b1d (see FIG. 10) can be decreased, as compared with the charged particle beam drawing apparatus of the related art, wherein the data DCL01 (see FIGS. 25A and 25B) corresponding to the cell CL01 (see FIG. 8B) extending over the block frame DPB11 (see FIG. 8A) and the block frame DPB12 (see FIG. 8A) is repetitively stored to the output buffer 10b1d1 (see FIGS. 18 and 19) of the input data dividing module 10b1d (see FIGS. 18 and 19).

In the charged particle beam drawing apparatus of the related art, as shown in FIG. 19, the data DDPB11 (see FIG. 25A) corresponding to the block frame DPB11 (see FIG. 8A) is transferred from the output buffer 10b1d1 of the input data dividing module 10b1d to the memory of the converter 10b1e1, and as shown in FIG. 20, the data DDPB12 (see FIG. 25B) corresponding to the block frame DPB12 (see FIG. 8A) is transferred from the output buffer 10b1d1 of the input data dividing module 10b1d to the memory of the converter 10b1e2.

In detail, in the charged particle beam drawing apparatus of the related art, as shown in FIG. 19, the data DCL01 (see FIG. 25A) of the cell CL01 (see FIG. 8B) extending over the block frame DPB11 (see FIG. 8A) and the block frame DPB12 (see FIG. 8A), the data DCL01 (see FIG. 25A) being a part of the data DDPB11 (see FIGS. 19 and 25A) corresponding to the block frame DPB11 (see FIG. 8A), is transferred from the output buffer 10b1d1 of the input data dividing module 10b1d to the memory of the converter 10b1e1, and as shown in FIG. 20, the data DCL01 (see FIG. 25B) of the cell CL01 (see FIG. 8B) extending over the block frame DPB11 (see FIG. 8A) and the block frame DPB12 (see FIG. 8A), the data DCL01 (see FIG. 25B) being a part of the data DDPB12 (see FIGS. 20 and 25B) corresponding to the block frame DPB12 (see FIG. 8A), is transferred from the output buffer 10b1d1 of the input data dividing module 10b1d to the memory of the converter 10b1e2.

Namely, in the charged particle beam drawing apparatus of the related art, as shown in FIGS. 19 and 20, the data DCL01 (see FIGS. 25A and 25B) of the cell CL01 (see FIG. 8B) extending over the block frame DPB11 (see FIG. 8A) and the block frame DPB12 (see FIG. 8A) is transferred from the output buffer 10b1d1 of the input data dividing module 10b1d, twice.

On the other hand, in the charged particle beam drawing apparatus 10 of the first embodiment, as shown in FIG. 11, the data DVDPB11 (see FIG. 16A) corresponding to the virtual block frame VDPB11 (see FIG. 8A) is transferred from the output buffer 10b1d1 of the input data dividing module 10b1d to the common memory 10b1e12 of the converter 10b1e1 corresponding to the block frame DPB11 (see FIG. 8A) and the converter 10b1e2 corresponding to the block frame DPB12 (see FIG. 8A).

In detail, in the charged particle beam drawing apparatus 10 of the first embodiment, as shown in FIG. 11, the data DCL01 (see FIG. 16A) of the cell CL01 (see FIG. 8B) extending over the block frame DPB11 (see FIG. 8A) and the block frame DPB12 (see FIG. 8A), the data DCL01 (see FIG. 16A) being a part of the data DVDPB11 (see FIGS. 11 and 16A) corresponding to the virtual block frame VDPB11 (see FIG. 8A), is transferred from the output buffer 10b1d1 of the input data dividing module 10$b$1$d$ to the common memory 10$b$1$e$12 of the converter 10$b$1$e$1 corresponding to the block frame DPB11 (see FIG. 8A) and the converter 10$b$1$e$2 corresponding to the block frame DPB12 (see FIG. 8A).

Namely, in the charged particle beam drawing apparatus 10 of the first embodiment, as shown in FIG. 11, the data DCL01 (see FIG. 16A) of the cell CL01 (see FIG. 8B) extending over the block frame DPB11 (see FIG. 8A) and the block frame DPB12 (see FIG. 8A) is transferred from the output buffer 10$b$1$d$1 of the input data dividing module 10$b$1$d$, once only.

Consequently, in the charged particle beam drawing apparatus 10 of the first embodiment, transfer time of data transferred from the output buffer 10$b$1$d$1 (see FIG. 11) of the input data dividing module 10$b$1$d$ (see FIG. 11) can be decreased, as compared with the charged particle beam drawing apparatus of the related art, wherein the data DCL01 (see FIGS. 25A and 25B) of the cell CL01 (see FIG. 8B) extending over the block frame DPB11 (see FIG. 8A) and the block frame DPB12 (see FIG. 8A) is transferred from the output buffer 10$b$1$d$1 (see FIGS. 19 and 20) of the input data dividing module 10$b$1$d$ (see FIGS. 19 and 20), twice.

In the charged particle beam drawing apparatus of the related art, as shown in FIGS. 19 and 20, the data DCL01 (see FIGS. 25A and 25B) of the cell CL01 (see FIG. 8B) extending over the block frame DPB11 (see FIG. 8A) and the block frame DPB12 (see FIG. 8A), the data DCL01 (see FIGS. 25A and 25B) being transferred from the output buffer 10$b$1$d$1 of the input data dividing module 10$b$1$d$ twice, is stored to the memory of the converter 10$b$1$e$1 and the memory of the converter 10$b$1$e$2, respectively.

On the other hand, in the charged particle beam drawing apparatus 10 of the first embodiment, as shown in FIG. 11, the data DCL01 (see FIG. 16A) of the cell CL01 (see FIG. 8B) extending over the block frame DPB11 (see FIG. 8A) and the block frame DPB12 (see FIG. 8A), the data DCL01 (see FIG. 16A) being transferred from the output buffer 10$b$1$d$1 of the input data dividing module 10$b$1$d$ once only, is stored to the common memory 10$b$1$e$12 of the converter 10$b$1$e$1 and the converter 10$b$1$e$2.

Consequently, in the charged particle beam drawing apparatus 10 of the first embodiment, the capacity of all of the memories including the common memory 10$b$1$e$12 (see FIG. 11) of the converters 10$b$1$e$1, 10$b$1$e$2 can be decreased as compared with the charged particle beam drawing apparatus of the related art, wherein the data DCL01 (see FIGS. 25A and 25B) of the cell CL01 (see FIG. 8B) extending over the block frame DPB11 (see FIG. 8A) and the block frame DPB12 (see FIG. 8A), the data DCL01 (see FIGS. 25A and 25B) being transferred from the output buffer 10$b$1$d$1 (see FIGS. 19 and 20) of the input data dividing module 10$b$1$d$ (see FIGS. 19 and 20) twice, is stored to the memory of the converter 10$b$1$e$1 (see FIGS. 19 and 20) and the memory of the converter 10$b$1$e$2 (see FIGS. 19 and 20), respectively.

In the charged particle beam drawing apparatus 10 of the first embodiment, two adjacent block frames DPB11, DPB12 (see FIG. 8A) combine into one virtual block frame VDPB11 (see FIG. 8A), and as shown in FIG. 2, one common memory 10$b$1$e$12 is provided with two converters 10$b$1$e$1, 10$b$1$e$2. In the charged particle beam drawing apparatus 10 of the third embodiment, more than two adjacent block frames combine into one virtual block frame. Also, in the charged particle beam drawing apparatus 10 of the third embodiment, one common memory is provided with more than two converters, and the number of the converters is equal to the number of the block frames which combine into one virtual block frame. In an example shown in FIGS. 2 and 8A, three adjacent block frames DPB11, DPB12, DPB13 (see FIG. 8A) combine into one virtual block frame, and three adjacent block frames DPB14, DPB15, DPB16 (see FIG. 8A) combine into another virtual block frame, in the charged particle beam drawing apparatus 10 of the third embodiment. In this example, one common memory is provided with three converters 10$b$1$e$1, 10$b$1$e$2, 10$b$1$e$3, and another common memory is provided with three converters 10$b$1$e$4, 10$b$1$e$5, 10$b$1$e$6.

In the charged particle beam drawing apparatus 10 of the present invention, the number of the block frames DPB11, DPB12 (see FIG. 8A) which combine into one virtual block frame VDPB11 (see FIG. 8A), corresponds to the number of the converters 10$b$1$e$1, 10$b$1$e$2 (see FIG. 2) which have one common memory 10$b$1$e$12 (see FIG. 2). In detail, in the charged particle beam drawing apparatus 10 of the first embodiment, as shown in FIGS. 2 and 8A, the number of the block frames DPB11, DPB12 (see FIG. 8A) which combine into one virtual block frame VDPB11 (see FIG. 8A) is 2, and the number of the converters 10$b$1$e$1, 10$b$1$e$2 (see FIG. 2) which have one common memory 10$b$1$e$12 (see FIG. 2) is 2. On the other hand, in the charged particle beam drawing apparatus 10 of the third embodiment, the number of the block frames DPB11, DPB12, DPB13 (see FIG. 8A) which combine into one virtual block frame is 3, and the number of the converters 10$b$1$e$1, 10$b$1$e$2, 10$b$1$e$3 (see FIG. 2) which have one common memory is 3.

In the charged particle beam drawing apparatus 10 of the first embodiment, as shown in FIG. 8, the stripe frame STR1 includes plural virtual block frames VDPB11, VDPB12, VDPB13, so that all block frames DPB11, DPB12, DPB13, DPB14, DPB15, DPB16 included in the stripe frame STR1 are respectively included in one of the virtual block frames VDPB11, VDPB12, VDPB13.

In the charged particle beam drawing apparatus 10 of the forth embodiment, above mentioned first embodiment, second embodiment and third embodiment are appropriately combined.

As many apparently widely different embodiments of this invention may be made without departing from the spirit and scope thereof, it is to be understood that the invention is not limited to the specific embodiments thereof except as defined in the appended claims.

What is claimed is:

1. A charged particle beam drawing apparatus, comprising:
a drawing portion for drawing patterns corresponding to figures included in cells included in a drawing data which has at least figure hierarchy and cell hierarchy, in a drawing area on a workpiece by a charged particle beam;
an input buffer, wherein the drawing data inputted to the charged particle beam drawing apparatus and corresponding to all of the drawing area on the workpiece is stored to the input buffer;
a dividing portion for dividing the drawing area on the workpiece into rectangular stripe frames and dividing the rectangular stripe frames into block frames;
a virtual block frame forming portion for combining at least a first block frame and a second block frame into a virtual block frame, wherein the first block frame and the second block frame are a part of the block frames in one of the stripe frames, and wherein the first block frame is adjacent to the second block frame;
an output buffer of an input data dividing module, wherein a data corresponding to the virtual block frame is read from the input buffer and is stored to the output buffer of the input data dividing module, and wherein the data corresponding to the virtual block frame is a part of the drawing data corresponding to all of the drawing area on the workpiece;

a transferring portion for transferring the data corresponding to the virtual block frame from the output buffer of the input data dividing module to a common memory;

a first converter for converting a data of a first figure into a first drawing apparatus internal format data, wherein the first figure is included in a cell extending over the first block frame and the second block frame, and is included in the first block frame, and wherein the data of the first figure is a part of the data corresponding to the virtual block frame transferred to the common memory; and a second converter for converting a data of a second figure into a second drawing apparatus internal format data in parallel with the first converter, wherein the second figure is included in the cell extending over the first block frame and the second block frame, and is included in the second block frame, and wherein the data of the second figure is a part of the data corresponding to the virtual block frame transferred to the common memory of the first converter corresponding to the first block frame and the second converter corresponding to the second block frame.

2. The charged particle beam drawing apparatus according to claim 1, wherein the virtual block frame forming portion combines block frames into one virtual block frame, so that the number of the block frames is equal to the number of converters, and one common memory is provided with the converters.

3. The charged particle beam drawing apparatus according to claim 2, wherein the number of the block frames which are combined into one virtual block frame is 2, and wherein the number of the converters which have one common memory is 2.

4. The charged particle beam drawing apparatus according to claim 2, wherein more than two adjacent block frames are combined into one virtual block frame, and wherein one common memory is provided with more than two converters, and wherein the number of the converters is equal to the number of the block frames which are combined into one virtual block frame.

5. The charged particle beam drawing apparatus according to claim 1, wherein the virtual block frame forming portion combines block frames into virtual block frames, so that all block frames included in one of the stripe frames are respectively included in one of the virtual block frames.

6. A charged particle beam drawing method, for drawing patterns corresponding to figures included in cells included in a drawing data which has at least figure hierarchy and cell hierarchy, in a drawing area on a workpiece by a charged particle beam, comprising:

storing the drawing data corresponding to all of the drawing area on the workpiece, to an input buffer;

dividing the drawing area on the workpiece into rectangular stripe frames and dividing the rectangular stripe frames into block frames;

combining at least a first block frame and a second block frame into a virtual block frame, wherein the first block frame and the second block frame are a part of the block frames in one of the stripe frames, and wherein the first block frame is adjacent to the second block frame;

reading a data corresponding to the virtual block frame from the input buffer and storing the data corresponding to the virtual block frame to an output buffer of an input data dividing module, wherein the data corresponding to the virtual block frame is a part of the drawing data corresponding to all of the drawing area on the workpiece;

transferring the data corresponding to the virtual block frame from the output buffer of the input data dividing module to a common memory of a first converter corresponding to the first block frame and a second converter corresponding to the second block frame;

converting a data of a first figure into a first drawing apparatus internal format data by the first converter, wherein the first figure is included in a cell extending over the first block frame and the second block frame, and is included in the first block frame, and wherein the data of the first figure is a part of the data corresponding to the virtual block frame transferred to the common memory; and converting a data of a second figure into a second drawing apparatus internal format data by the second converter in parallel with the first converter, wherein the second figure is included in the cell extending over the first block frame and the second block frame, and is included in the second block frame, and wherein the data of the second figure is a part of the data corresponding to the virtual block frame transferred to the common memory.

7. The charged particle beam drawing method according to claim 6, wherein block frames are combined into one virtual block frame, so that the number of the block frames is equal to the number of converters, and one common memory is provided with the converters.

8. The charged particle beam drawing method according to claim 7, wherein the number of the block frames which are combined into one virtual block frame is 2, and wherein the number of the converters which have one common memory is 2.

9. The charged particle beam drawing method according to claim 7, wherein more than two adjacent block frames are combined into one virtual block frame, and wherein one common memory is provided with more than two converters, and wherein the number of the converters is equal to the number of the block frames which are combined into one virtual block frame.

10. The charged particle beam drawing method according to claim 6, wherein block frames are combined into virtual block frames, so that all block frames included in one of the stripe frames are respectively included in one of the virtual block frames.

* * * * *